United States Patent
Manipatruni et al.

(10) Patent No.: US 11,264,476 B2
(45) Date of Patent: Mar. 1, 2022

(54) MAGNETIC CONTACTS FOR SPIN QUBITS

(71) Applicant: INTEL CORPORATION, Santa Clara, CA (US)

(72) Inventors: Sasikanth Manipatruni, Portland, OR (US); Ravi Pillarisetty, Portland, OR (US); Dmitri E. Nikonov, Beaverton, OR (US); Ian A. Young, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 16/349,201

(22) PCT Filed: Dec. 27, 2016

(86) PCT No.: PCT/US2016/068756
§ 371 (c)(1),
(2) Date: May 10, 2019

(87) PCT Pub. No.: WO2018/125062
PCT Pub. Date: Jul. 5, 2018

(65) Prior Publication Data
US 2020/0194566 A1    Jun. 18, 2020

(51) Int. Cl.
*H01L 29/45* (2006.01)
*G06N 10/00* (2022.01)
(Continued)

(52) U.S. Cl.
CPC .............. *H01L 29/45* (2013.01); *G06N 10/00* (2019.01); *H01L 21/28568* (2013.01);
(Continued)

(58) Field of Classification Search
CPC combination set(s) only.
See application file for complete search history.

(56) References Cited

U.S. PATENT DOCUMENTS 6,355,953 B1 * 3/2002 Kirczenow ....... H01L 29/66984
257/295
2005/0117617 A1 6/2005 Yoshida et al.
(Continued)

FOREIGN PATENT DOCUMENTS

JP    2010129608 A    6/2010

OTHER PUBLICATIONS

PCT/US2016/068756, International Search Report and Written Opinion, dated Sep. 12, 2017, 13 pages.

*Primary Examiner* — Moin M Rahman
(74) *Attorney, Agent, or Firm* — Patent Capital Group

(57) ABSTRACT

Systems, apparatus, and methods for initializing spin qubits with no external magnetic fields are described. An apparatus for quantum computing includes a quantum well and a pair of contacts. At least one of the contacts is formed of a ferromagnetic material. One of the contacts in the pair of contacts interfaces with a semiconductor material at a first position adjacent to the quantum well and the other contact in the pair of contacts interfaces with the semiconductor material at a second position adjacent to the quantum well. The ferromagnetic material initializes an electron or hole with a spin state prior to injection into the quantum well.

23 Claims, 16 Drawing Sheets

(51) Int. Cl.
*H01L 21/285* (2006.01)
*H01L 29/12* (2006.01)
*H01L 29/66* (2006.01)

(52) U.S. Cl.
CPC ...... *H01L 21/28575* (2013.01); *H01L 29/122* (2013.01); *H01L 29/66977* (2013.01); *H01L 29/66984* (2013.01)

(56) References Cited

U.S. PATENT DOCUMENTS

| | | | | |
|---|---|---|---|---|
| 2006/0076592 | A1* | 4/2006 | Salib | H01F 10/193 |
| | | | | 257/295 |
| 2007/0059877 | A1* | 3/2007 | Koo | H01L 29/66984 |
| | | | | 438/213 |
| 2007/0138565 | A1* | 6/2007 | Datta | H01L 29/122 |
| | | | | 257/369 |
| 2009/0279355 | A1* | 11/2009 | Rakshit | H01L 29/7841 |
| | | | | 365/185.01 |
| 2011/0233524 | A1 | 9/2011 | Wang et al. | |
| 2015/0001547 | A1* | 1/2015 | Hikosaka | H01L 29/1075 |
| | | | | 257/76 |
| 2017/0077394 | A1* | 3/2017 | Saida | H01L 43/08 |

\* cited by examiner

MAGNETIC CONTACTS FOR SPIN QUBITS

RELATED APPLICATION(S)

This application is a national stage filing under 35 U.S.C. § 371 of International Patent Application No. PCT/US2016/068756, filed Dec. 27, 2016, which is hereby incorporated by reference herein in its entirety.

TECHNICAL FIELD

A quantum bit or qubit is a unit of quantum information. The present disclosure relates to spin qubits which use the spin state of an electron to convey information. In particular, the present disclosure relates to spin-based quantum devices and systems and methods for interacting with qubits.

DETAILED DESCRIPTION

Figure 1:
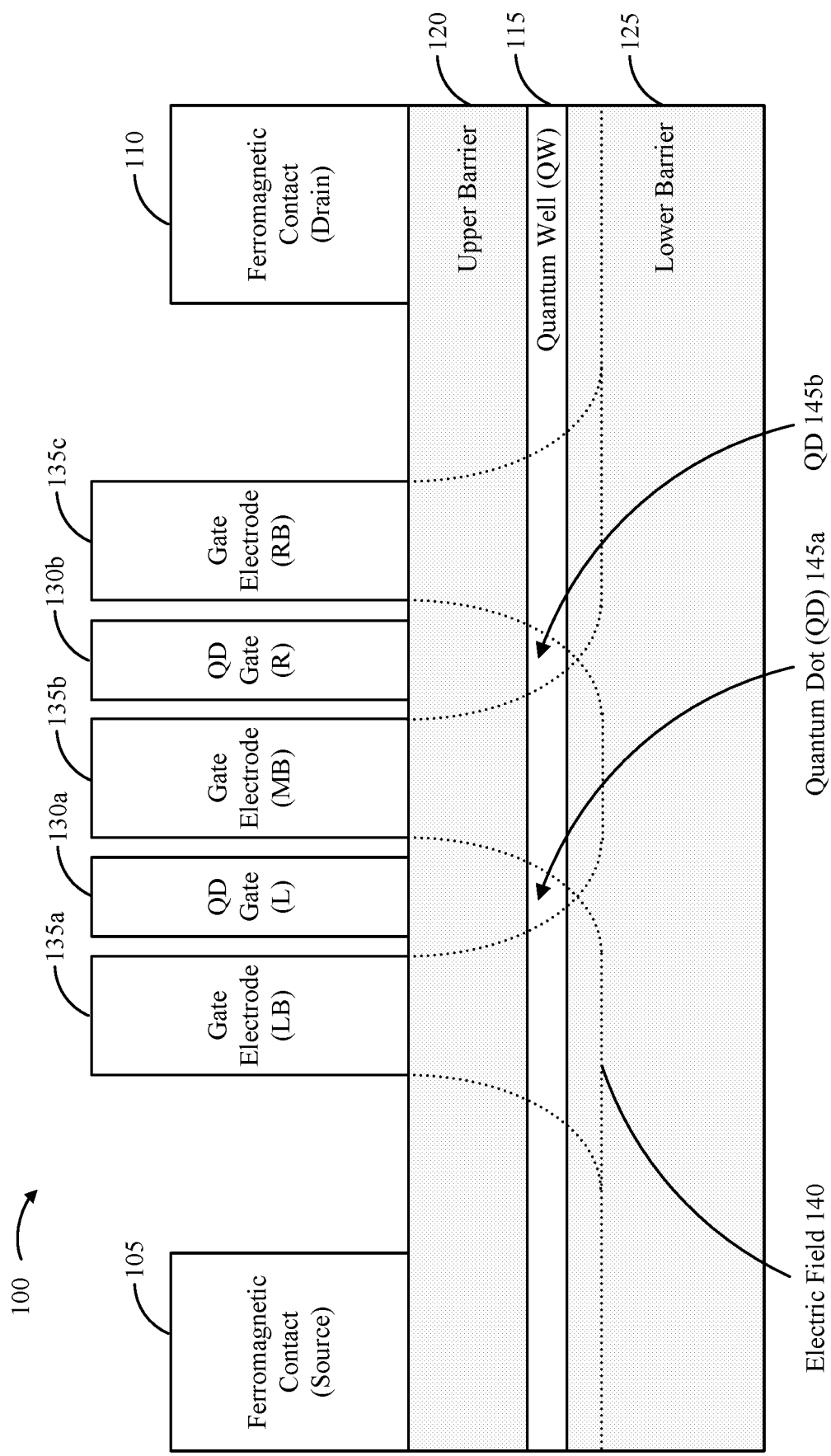
FIG. 1 is a block diagram illustrating one example of a device for quantum computing in which the present systems and methods may be implemented.

A quantum bit or qubit, as it is referred to herein, is a unit of quantum information. A qubit can have multiple states. So a qubit can act as a bit with two states (e.g., a "0" or a "1"), or can hold even more information (e.g., various linear combinations of the two states). The present systems and methods relate to qubits and more specifically to spin qubits that convey information based on a spin state of quantum material.

The following description discusses spin qubits in terms of the spin state of an electron. However, it is appreciated that other types of spin qubits could be used with the present systems and methods.

Electrons are subatomic particles. Electrons include an intrinsic angular momentum, or spin. The spin of an electron can have different states (e.g., spin states). For example, an electron can have a spin state with projection of $+\hbar/2$ or $-\hbar/2$ (where $\hbar$ is the reduced Planck constant) on a certain axis. They are designated as $|1\rangle$ and $|0\rangle$, respectively. The axis can be "vertical" and the states can be "up" and "down", respectively. In another example, an electron can have a spin state that can be represented as a linear combination $|\psi\rangle = \alpha|1\rangle + \beta|0\rangle$, where coefficients $$\alpha = \cos\left(\frac{\theta}{2}\right), \beta = e^{i\varphi}\sin\left(\frac{\theta}{2}\right),$$

and $|\alpha|^2 + |\beta|^2 = 1$, where $\alpha$ and $\beta$ are probability amplitudes and can be complex numbers. These coefficients are parametrized by variables $\varphi$ and $\theta$, which have the meaning of the azimuthal and polar angles of the spin. Thus a state of a qubit can be mapped to a point on the surface of a sphere where the spin is pointing.

Quantum computing, therefore, involves the setting (e.g., initialization, loading) of the spin state of an electron, the manipulation (e.g., rotation, i.e., rotate 90 degrees, rotate 180 degrees, etc.) of the spin state of the electron, and/or the reading of the spin state of the electron. It is appreciated that the spin of an electron produces a magnetic field and that the spin state of an electron is influenced by magnetic fields.

In general, a quantum device includes a quantum well (QW) (e.g., channel) that extends between a pair of contacts (e.g., a source contact and a drain contact). The quantum device includes a set of gate electrodes and at least one quantum dot (QD) gate. The QW is a thin layer which confines electrons (or holes) in the dimension perpendicular to the thin layer but does not restrict the movement of electrons (or holes) in other dimensions (between the pair of contacts, for example). The set of gate electrodes are energized to create a set of electric potentials that in connection with the QD gate creates a QD in the QW. In other words the electric potentials are configured to confine an electron (or hole) to a particular point in the QW to create a QD.

In the QD, an electron (or hole) behaves as a single object with a particular state (e.g., a spin state) and, as such, can be used as a qubit. In the QD, the spin state of the electron can be set, read, and/or manipulated.

One of the current approaches for setting, reading, and/or manipulating the spin state of an electron involves introducing a number of electrons (or holes) into the QW via the pair of contacts. The gate electrodes are configured (e.g., energized) to confine at least one electron (or hole) in a QD. According to the current approach, the spin state of the electron is set and/or manipulated in the QD by subjecting the electron to a magnetic field (e.g., a radio frequency (RF) magnetic field) that is configured to set and/or manipulate the spin state of the individual electron to a desired spin state. This approach, however, is associated with several challenges.

One of these challenges is that it takes a substantial amount of energy to create the magnetic fields necessary to manipulate the spin state of the electron. The magnetic field needs to reach a certain value to effectively manipulate the spin state of the electron. The magnetic field is generally produced by nearby quasi-steady electrical current(s) which dissipate Joule heat in wires. So this approach is not very power efficient.

Another one of these challenges is that it is hard to control how much the spin state of the electron rotates or changes as a result of the created magnetic field. This challenge is exacerbated when the electron has an unknown spin state to begin with. It is appreciated that even if the current spin state is known, the imprecision associated with manipulating the spin state with a created magnetic field (e.g., a pulse or arrangement of pulses) makes it difficult to control how much the spin state of the electron rotates or changes.

Yet another one of these challenges is that the created magnetic field extends to a greater area than the QD, which results in the magnetic field influencing nearby electrons (in other QDs, for example) that are in proximity to (e.g., near to) the QD. In other words, the current approach results in undesirable cross talk and/or inefficient spacing requirements.

As discussed below, the present systems and methods use a different approach for setting and/or manipulating qubits (e.g., the spin state of electrons). In particular, the present systems and methods use a spin injector or spin well that sets the spin state of the electrons before the electrons enter the QW. Setting the spin state of an electron prior to injecting the electron into the QW eliminates the need to apply spin state manipulating magnetic forces when the electron is in the QD. This reduces power consumption as well as magnetic cross talk issues, while increasing the control and accuracy of the setting/manipulating of the spin state of an electron.

In the present systems and methods, the contacts (at least one of the contacts, for example) are formed of a ferromagnetic material. The ferromagnetic material induces a particular spin state on an electron that passes through the ferromagnetic material (the electron is in a current of electrons, for example), so that upon entering the QW, the electron is already initialized with a particular spin state.

It is appreciated that a ferromagnetic material is such because the electrons in it have a net polarization (e.g., a net average spin state). For example, 60% of the electrons may have an "up" polarization and the remaining 40% of the electrons may have a "down" polarization. This net difference results in a net magnetism. If it has a stable non-zero value even in the absence of an external magnetic field, this makes the material ferromagnetic. As electrons pass through the ferromagnetic material, the electrons are influenced by the polarization of the electrons within the ferromagnetic material. In particular, an electron is influenced to polarize itself (e.g., align its spin state) with the polarization (e.g., spin state) of the electrons that it is passing by. So it follows that the more magnetic (e.g., the higher the net polarization) the ferromagnetic material is, the more influence an electron will receive as it passes through the ferromagnetic material, which increases the likelihood of the electron being loaded with the intended spin state.

It is appreciated that a variety of ferromagnetic materials may be used with the present systems and methods. In some cases, traditional ferromagnetic materials, such as Iron (Fe), Nickel (Ni), Cobalt (Co), and most of their alloys (e.g., CoNiFe), may be used. In some cases, traditional ferromagnetic materials may have majority polarization of at least 60%. The majority polarization (e.g., "up" spin) of a traditional ferromagnetic material may be somewhat increased by cooling. The present systems and methods may utilize traditional ferromagnetic materials as contacts.

In other cases, the ferromagnetic material may be ferromagnetic due to the structure (e.g., lattice structure) associated with the ferromagnetic material. For example, the lattice structure of Heusler alloys may be configured to enhance the majority polarization and to minimize (or even eliminate) the minority polarization. For example, Heusler alloy based ferromagnetic materials may have a majority polarization of at least 80%, have a majority polarization of at least 90%, or have a majority polarization of 100%, depending on the particular Heusler alloy. So the polarization associated with a Heusler alloy may be very high or even complete, making it a very effective spin well (so that all of the electrons passing through the Heusler alloy are spin polarized, resulting in complete or near complete polarization, for example).

It is appreciated that the ferromagnetic materials have atomic level polarization so that electrons passing through the ferromagnetic material are strongly influenced by the polarization. However the ferromagnetic material produce a relatively weak magnetic field that extends outside of the ferromagnetic material, which will not significantly influence spins of electrons there. This is a beneficial property in quantum computing devices where electrons are impacted by stray magnetic fields (where stray magnetic fields result in cross-talk or impact the spin state of neighboring electrons, for example).

The ferromagnetic material has an epitaxial relation with the material that it interfaces with (e.g., boundary layer or QW). The epitaxial relationship and the interface properties that result from a particular combination of materials in the epitaxial relationship may impact the flow of electrons between the ferromagnetic material and the material that it interfaces with. In some cases, the composition of the ferromagnetic material and/or the composition of the material that it interfaces with may be selected so that the epitaxial interface between these interfacing materials produces a zero or negative Schottky barrier. It is appreciated that a zero or negative Schottky barrier indicates a low internal ohmic resistance of a particular epitaxial contact.

Heusler alloys are highly tunable in terms of compositional structure. This high compositional tunability allows the compositional structure of the ferromagnetic material to be matched with the other material (e.g., the boundary layer or QW, referred to generally as the semiconductor of choice) to achieve desirable interface properties between the ferromagnetic contact and the other material.

In some embodiments, the interface properties between the ferromagnetic material and the semiconductor of choice (the barrier layer or the QW, for example) can be tuned based on the lattice parameter of the Heusler alloy. In some cases, the lattice parameter for the Heusler alloy can be tuned to match the semiconductor of choice by the choice of the first metal atom in the Heusler alloy. It is appreciated that the boundary/interface between the Heusler alloy and the semiconductor of choice is an epitaxial interface and that desirable interface properties may be achieved when the physical lattice structure of the Heusler alloy complements/matches/aligns with the lattice/crystalline structure of the semiconductor of choice. So the lattice parameter may be chosen to align the lattice/crystalline structures so that the electrical properties of the epitaxial interface between the Heusler alloy and the semiconductor of choice do not interfere with the flow of electrons between the ferromagnetic material and the semiconductor of choice.

In one example, the semiconductor of choice is a barrier layer that consists of a semiconductor and/or an insulator (e.g., Magnesium oxide (MO), Silicon Germanium 30 (SiGe30)). In another example, the semiconductor of choice is a quantum well (QW) that consists of semiconductor material (e.g., Silicon (Si), Germanium (Ge), Gallium arsenide (GaAs), Indium phosphide (InP), Indium arsenide (InAs), Gallium antimonide (GaSb), Indium antimonide (InSb)).

In general, full Heusler alloys have the structure of $X_2YZ$ (e.g., $L2_1$ ordered Heusler alloys) where X-atom and Y-atom are generally selected from the transition elements and Z-atom is generally selected from the lighter elements and semi Heusler alloys have the structure of XYZ (e.g., $C1_b$ ordered Heusler alloys). However, it is appreciated that other structures, for both Heusler alloys and other alloys, are also possible.

While much of the below discussion relates to Heusler alloys and the compositional structure resulting from the epitaxial relationship of Heusler alloys with other materials, it is appreciated that the other types of alloys (e.g., other than Heusler alloys) could be used without departing from the scope of the present systems and methods.

Referring now to the Figures, FIG. 1 is a block diagram illustrating one example of a device for quantum computing 100 in which the present systems and methods may be implemented. The device for quantum computing 100 includes a source ferromagnetic contact 105 and a drain ferromagnetic contact 110. The ferromagnetic contacts 105, 110 are electronically coupled to a quantum well (QW) 115 that extends between the ferromagnetic contacts 105, 110. The QW 115 acts as a channel between the ferromagnetic contacts 105, 110 and is configured to limit the movement of an electron (or hole) to effectively a line. For example, the boundary conditions between an upper barrier 120 and the QW 115 and the boundary conditions between a lower barrier 125 and the QW 115 confine the electrons (or holes) in the direction perpendicular to the upper barrier 120 and the lower barrier 125.

The device for quantum computing 100 may further include one or more gate electrodes 135 (e.g., left gate electrode (LB) 135a, middle gate electrode (MB) 135b, and right gate electrode (RB) 135c). The gate electrodes 135 may produce a constant electric field 140 to confine the electrons (or holes) within the QW 115 to one or more quantum dots (QD) 145 (e.g., left QD 145a, right QD 145b). In the QD 145, an electron (or hole) may behave as its own entity (not tied to a particular atom, for example). In some cases, a QD gate 130 (e.g., left QD gate (L) 130a, right QD gate (R) 130b) may be used to attract an electron (or hole) into the QD 145, to manipulate the electron (or hole) in the QD 145, and/or to read the state (e.g., spin state) of the electron (or hole) in the QD 145.

Currently, electrons (or holes) enter the QW 115 uninitialized from the source or drain contacts (the contacts are made of non-magnetic materials, for example). So in current approaches, the QD gate 130 is also used to initialize the spin state of the electron (or hole). For example, the QD gate 130 may initialize the spin state of the electron (or hole) by alternating a current field in the QD gate 130 to generate a magnetic field that interacts with the electron (or hole) in the QD 145. As noted previously, this approach is both inefficient and lacks reliability in addition to having undesirable side effects (e.g., cross talk). As described herein, the disclosed systems and methods overcome these challenges by initializing the electron (or hole) prior to its injection into the QW 115.

This may be done by replacing current non-magnetic contacts with ferromagnetic contacts (e.g., the ferromagnetic contacts 105, 110). As an electron (or hole) passes through a ferromagnetic material (e.g., a ferromagnetic contact), the spin state of the electron (or hole), which produces a magnetic field, is influenced by the magnetic field produced by the ferromagnetic material. When the magnetism of the ferromagnetic material is strong enough, it manipulates the spin state of the electron (or hole). Since ferromagnetic materials generally have magnetic components in both directions/polarizations (except when there is 100% polarization, for example), an electron (or hole) passing through the ferromagnetic material may be influenced by both polarizations, which impact the final spin state of the electron (or hole). So, higher polarizations of the ferromagnetic material are beneficial as they increase the reliability of setting the desired spin state.

It is appreciated that a wide variety of ferromagnetic materials may be used for the ferromagnetic contacts 105, 110. These include both traditional ferromagnetic compositions (e.g., Iron (Fe), Nickel (Ni), Cobalt (Co), and most of their alloys) as well as compositions that have magnetic polarization as a result of atomic structure of the composition (e.g., Heusler alloys). In other cases, the composition may be selected so that the atomic structure (e.g., lattice structure) associated with the composition cancels out some or all of the undesired polarization. Such techniques may result in the ferromagnetic contacts 105, 110 with greater than 60% (desired) polarization, greater than 70% (desired) polarization, greater than 80% (desired) polarization, greater than 90% (desired) polarization, or even up to 100% (desired) magnetic polarization. Using the magnetic polarization of the ferromagnetic contacts 105, 110, the described systems and methods may initialize an electron (or hole) with a particular (e.g., a desired) spin state so that the electron is initialized or loaded before it enters the QW 115. So the ferromagnetic contacts 105, 110 directly load the electrons (or holes) that pass through them with a particular spin state.

Figure 2:
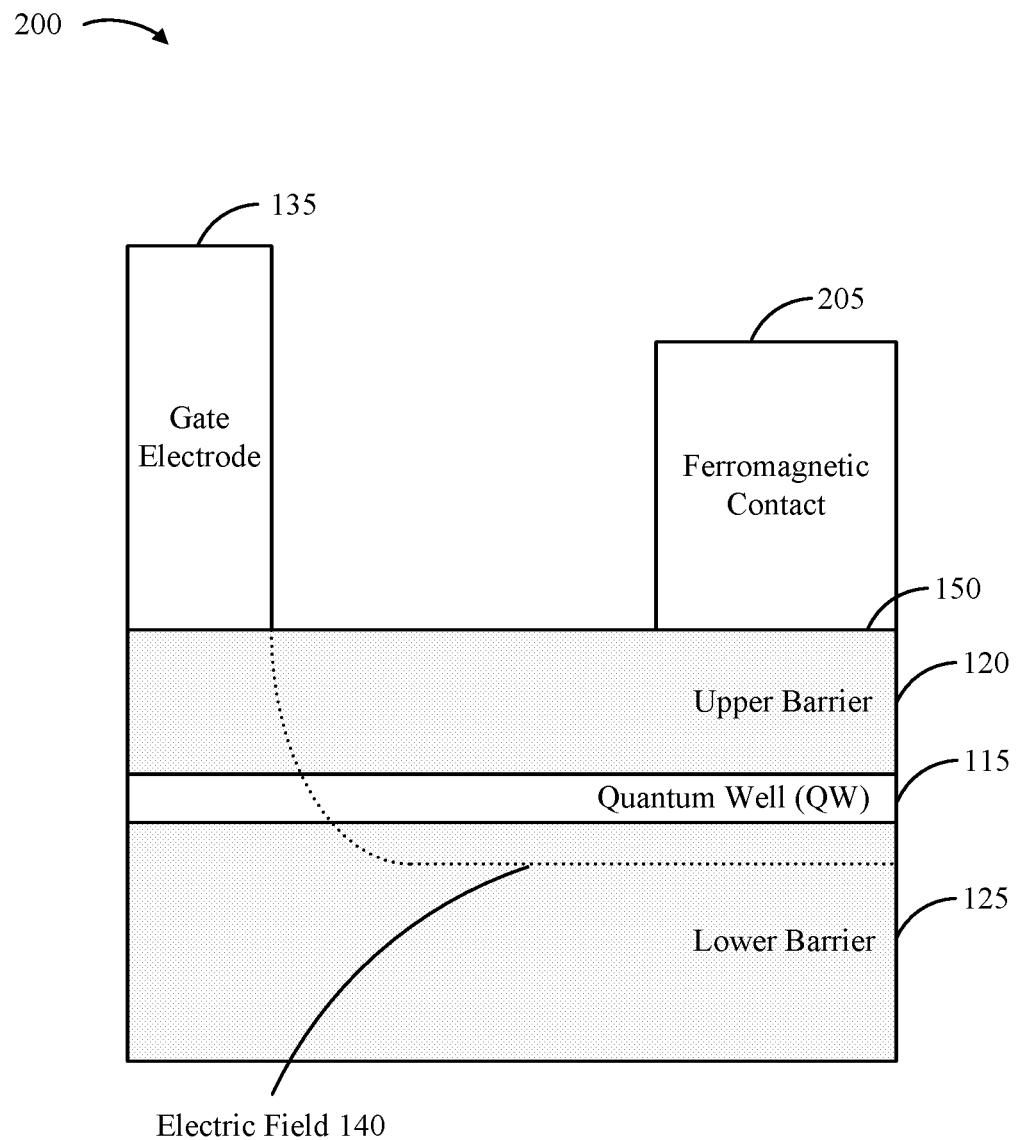
FIG. 2 is a block diagram illustrating one example of a quantum computing device where the ferromagnetic contact is separated from the QW by an upper barrier.

FIG. 2 is a block diagram illustrating one example of a quantum computing device 200 where a ferromagnetic contact 205 is separated from the QW 115 by the upper barrier 120. The ferromagnetic contact 205 may be one example of the ferromagnetic contacts 105, 110 illustrated with respect to FIG. 1. In some cases, the upper barrier 120 may act as a tunnel barrier that allows electrons (or holes) from the ferromagnetic contact 205 to tunnel to the QW 115. Additionally or alternatively, the upper barrier 120 may act as a tunnel barrier that allows electrons (or holes) from the QW 115 to tunnel to the ferromagnetic contact 205.

In some embodiments, the ferromagnetic contact 205 may have an epitaxial interface 150 with the upper barrier 120. In other words, the crystal structure of the ferromagnetic contact 205 interfaces with the crystal structure of the upper barrier 120 at the epitaxial interface 150. Due to the size and properties of electrons (or holes), differences between crystal structures at the epitaxial interface 150 may impact the flow of electrons (or holes) across the epitaxial interface 150. This relationship is discussed in further detail below.

Figure 3:
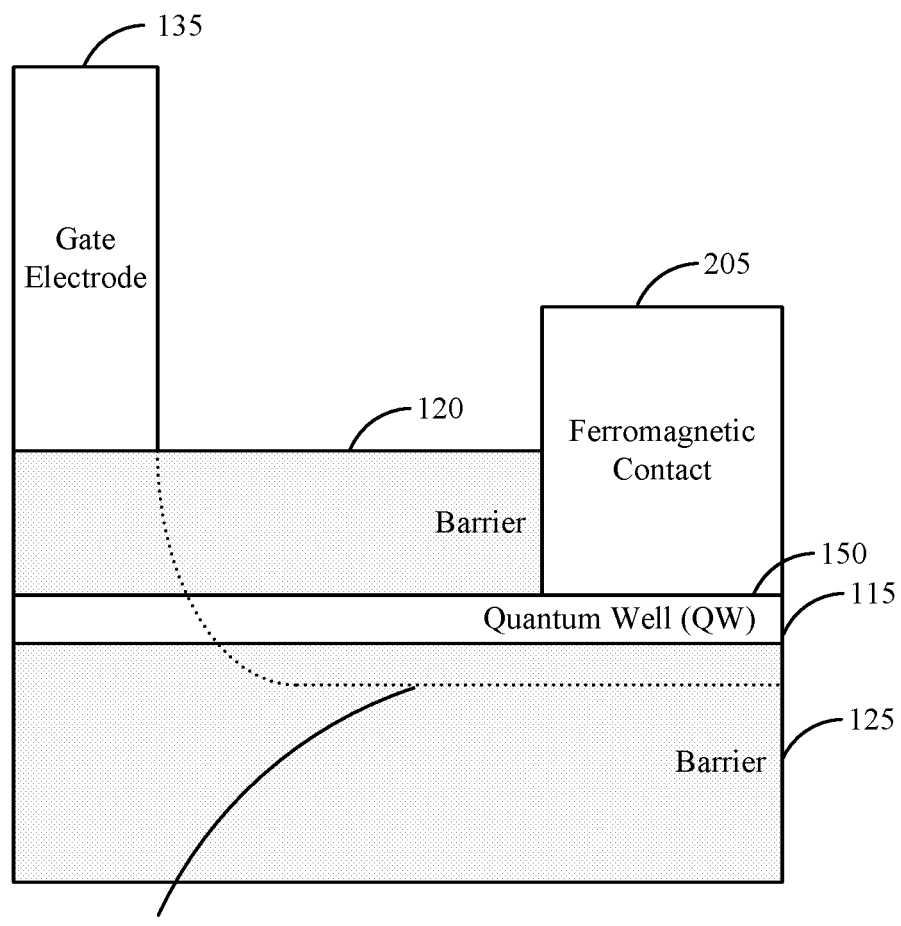
FIG. 3 is a block diagram illustrating one example of a quantum computing device where the ferromagnetic contact is directly connected to the QW.

FIG. 3 is a block diagram illustrating one example of a quantum computing device 300 where the ferromagnetic contact 205 is directly connected to the QW 115. In this embodiment, the ferromagnetic contact 205 may have the epitaxial interface 150 with the QW 115. In other words, the crystal structure of the ferromagnetic contact 205 interfaces with the crystal structure of the QW 115 at the epitaxial interface 150. As noted above, due to the size and properties of electrons (or holes), differences between crystal structures at the epitaxial interface 150 may impact the flow of electrons (or holes) across the epitaxial interface 150. This relationship is discussed in further detail below.

Figure 4:
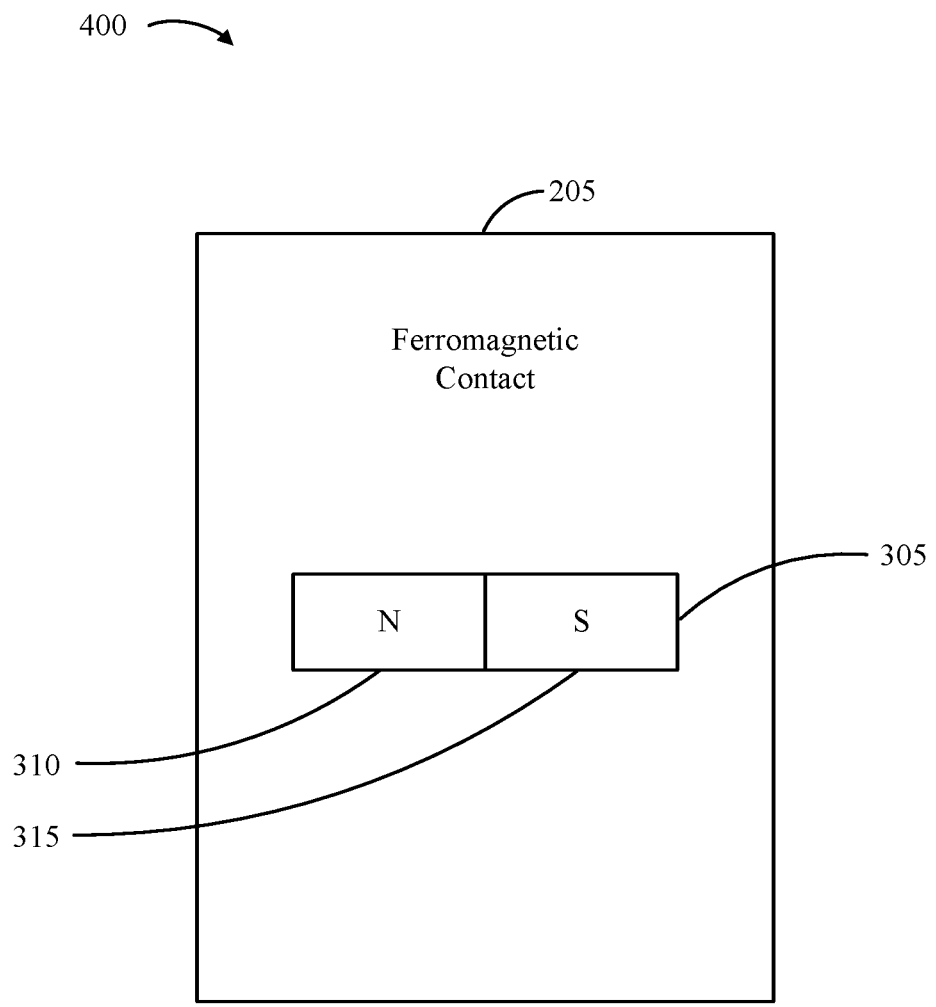
FIG. 4 is a block diagram illustrating one example of a ferromagnetic contact having a first magnetic polarization.

FIG. 4 is a block diagram illustrating an example 400 of the ferromagnetic contact 205 having a first magnetic polarization. It is appreciated that ferromagnetic materials have a dominant or majority polarization (e.g., direction of magnetism) and, in many cases (when there is not 100% majority polarization, for example), a minority polarization. It is further appreciated that it is the interaction of an electron (or hole) with these polarizations (both majority polarization and minority polarization) that define the spin state of the electron (or hole).

As illustrated in FIG. 4, the ferromagnetic contact 205 may have a majority magnetic polarization (100% majority polarization, for example) that is represented by a dipole magnet 305 having a North end 310 and a South end 315 where the North end 310 is pointed to the left. In one embodiment, this first polarization may cause an electron passing through the ferromagnetic contact 205 to be initialized with an "up" spin state.

Figure 5:
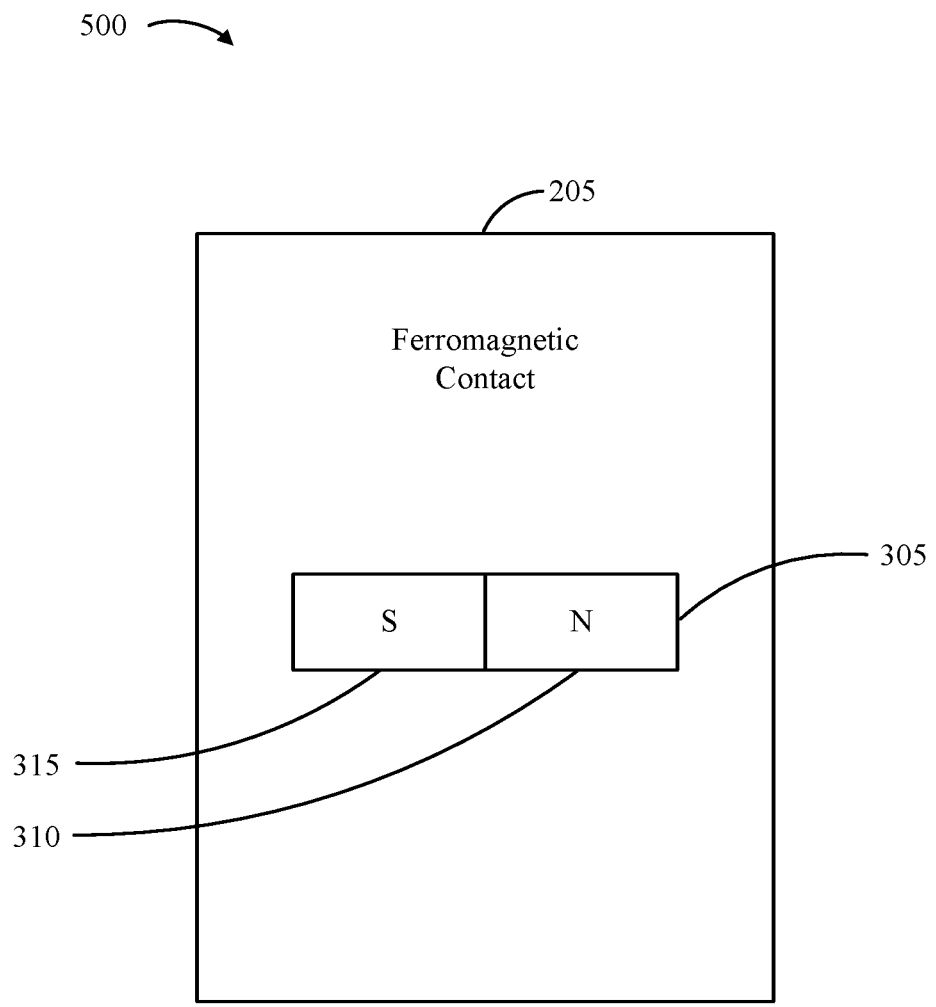
FIG. 5 is a block diagram illustrating one example of a ferromagnetic contact having a second magnetic polarization.

FIG. 5 is a block diagram illustrating an example 500 of the ferromagnetic contact 205 having a second magnetic polarization. As illustrated in FIG. 5, the ferromagnetic contact 205 may have a majority magnetic polarization (100% majority polarization, for example) that is represented by the dipole magnet 305 having the North end 310 and the South end 315 where the North end 310 is pointed to the right. In one embodiment, this second polarization may cause an electron passing through the ferromagnetic contact 205 to be initialized with a "down" spin state.

Although FIGS. 4 and 5 illustrate only two examples of polarization, it is appreciated that the ferromagnetic contact 205 be configured to have any of a wide variety of polarizations (e.g., different orientations and/or amplitudes). In some cases, the polarization of the ferromagnetic contact 205 or at least a portion of the ferromagnetic contact 205 may be dynamically altered to cause an electron (or hole) to be initialized or loaded with a different spin state. In one example, the polarization of at least a portion of the ferromagnetic contact 205 may be flipped (using spin torque transfer techniques, for example).

As noted above, traditional ferromagnetic materials may have majority polarizations in the range of 60%. In this scenario, an electron (or hole) may have 60% influence to a first polarization and 40% influence to a second polarization. The result of these competing influences may be that some of the electrons (or holes) passing through the ferromagnetic material may not be initialized to the desired spin state (e.g., resulting in potentially "bad" qubits). Various techniques may be used to increase the polarization of the ferromagnetic contact 205. Other approaches include using ferromagnetic materials that provide high magnetic polarity due to the crystal/lattice structure of the ferromagnetic material. One example of these types of materials is Heusler alloys.

Figure 6:
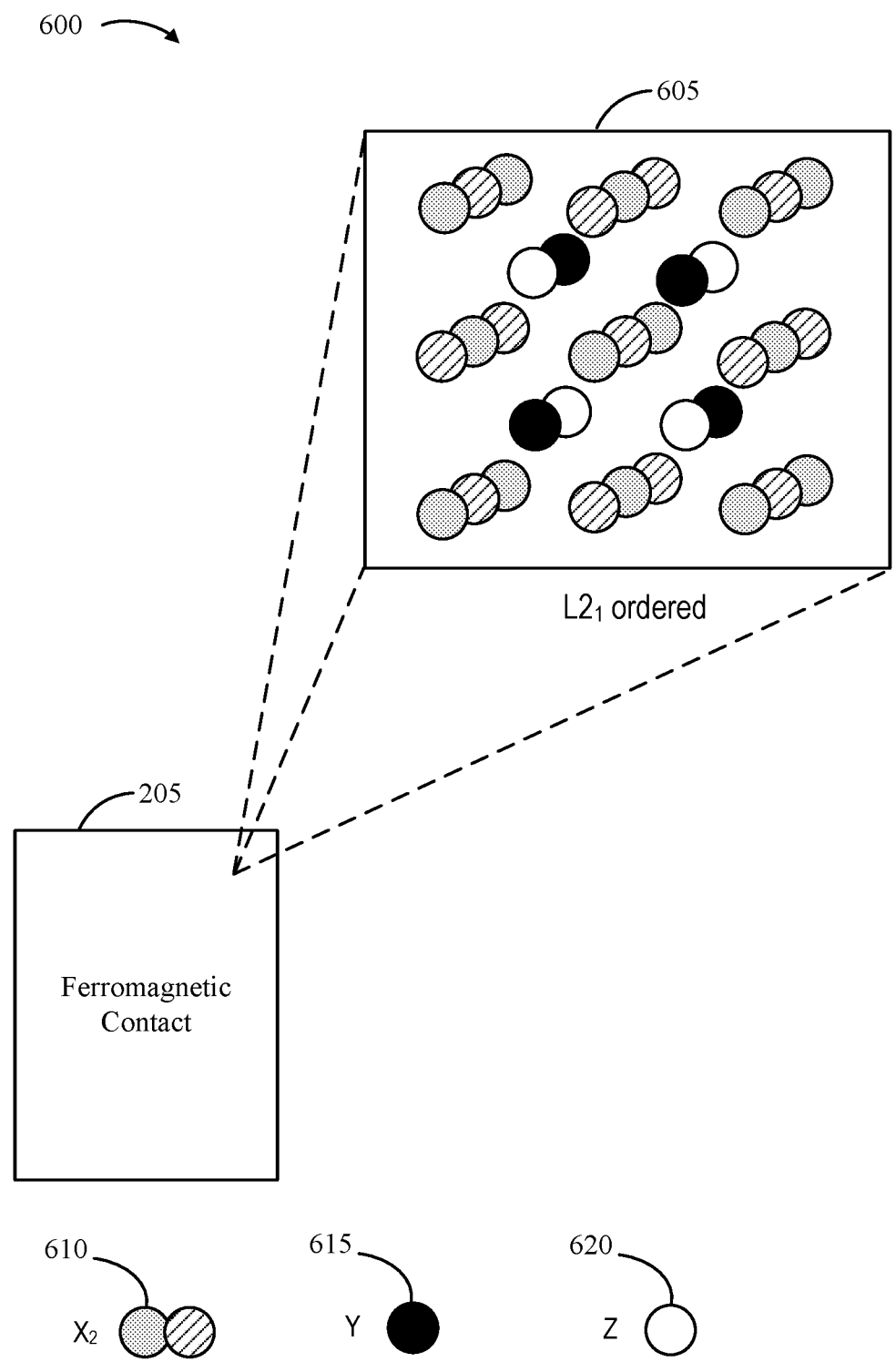
FIG. 6 is a block diagram illustrating one example of a ferromagnetic contact that is formed from a full Heusler alloy.

FIG. 6 is a block diagram illustrating an example 600 of the ferromagnetic contact 205 that is formed from a full Heusler alloy. For example, the ferromagnetic contact 205 is a full Heusler alloy that has an $L2_1$ ordered 605 lattice structure. Full Heusler alloys (e.g., $L2_1$ ordered 605 Heusler alloys) have the form of $X_2YZ$, where X-atom 610 and Y-atom 615 are generally selected from the transition elements and Z-atom 620 is generally selected from the lighter elements. In a Heusler alloy, the atoms are ordered in a particular lattice structure (e.g., $L2_1$ ordered 605). This known ordering can be leveraged to effectively cancel out the undesirable polarization. With this in mind, the composition of the Heusler alloy can be selected so that the Heusler alloy has 100% polarization. In other words, the composition of the Heusler alloy can be selected to cancel out most (or all) of the minority polarization so that the Heusler alloy expresses mostly (or only) the majority polarization.

When a current is passed through the ferromagnetic contact 205, the electrons (or holes) pass through the $L2_1$ ordered 605 lattice structure and are influenced by the expressed polarizations. The magnetic moment or spin polarization of the electron (or hole) adjusts to align with the influencing polarization, which initializes/loads the electron (or hole) with a particular spin polarization or spin state as the electron (or hole) passes through the ferromagnetic contact 205. The high polarization of Heusler alloys result in consistent and reliable initialization/loading so that the electron (or hole) has a known spin state prior to entering (e.g., being injected) into the QW (e.g., QW 115).

It is appreciated that a Heusler alloy can be composed of any of a variety of elements. Since the polarization of a Heusler alloy is driven by atomic polarization rather than traditional ferromagnetic elements and alloys, the amount of flexibility in selecting the elements in the Heusler alloy is vast. As illustrated in FIG. 6, there are two X-atoms 610 components which are identified with different patterns and the respective Y-atom 615 and Z-atom 620 components are each identified with a distinctive pattern. While each of the components is identified with a distinctive pattern, it is appreciated that any particular component could be "split" to include two or more elements insomuch as the two or more elements are ordered as per the ordering associated with that particular component. Additionally or alternatively, the same element may be used for more than one component (or portions of a component, for example).

Figure 7:
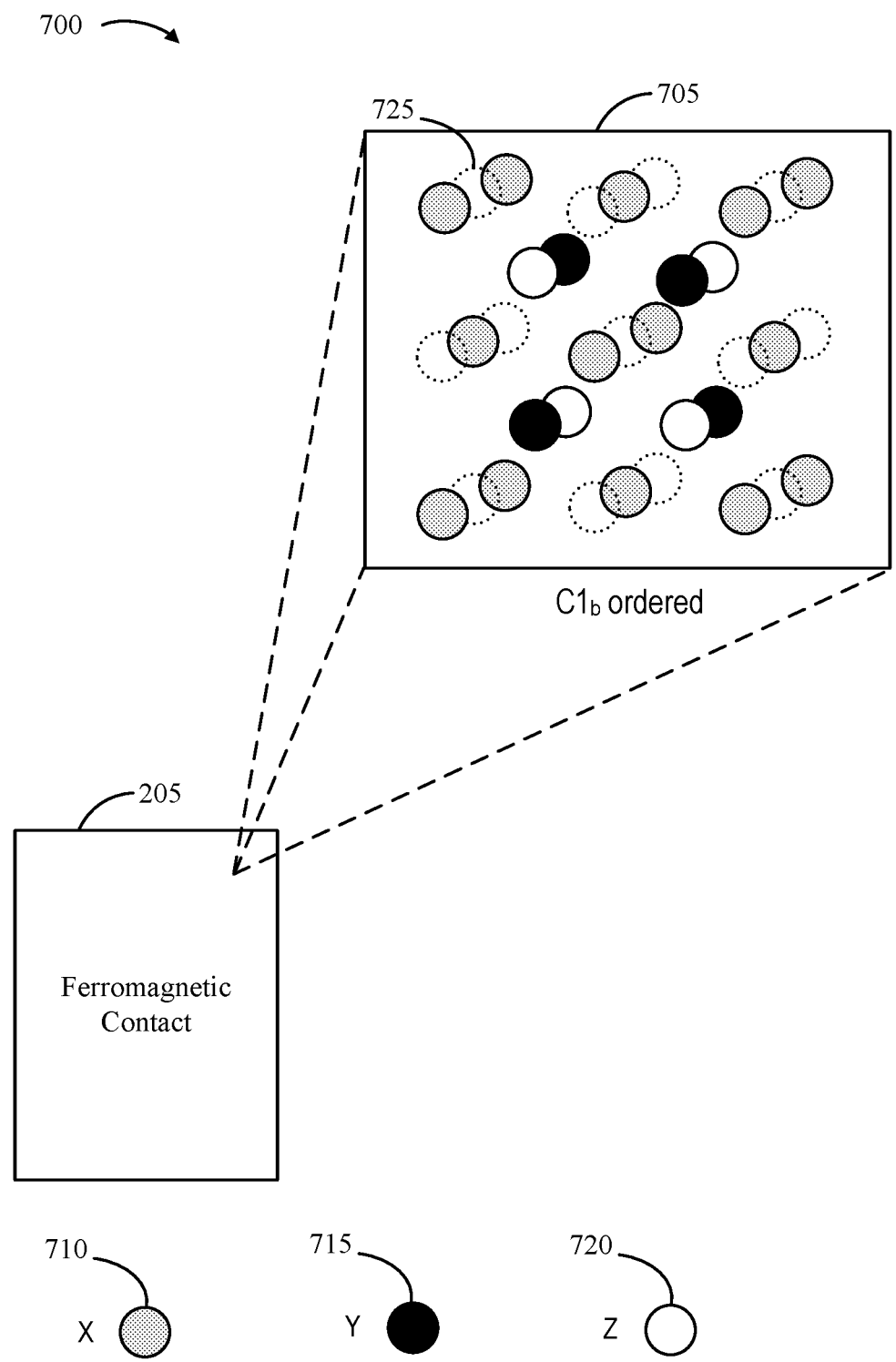
FIG. 7 is a block diagram illustrating one example of a ferromagnetic contact that is formed from a semi Heusler alloy.

FIG. 7 is a block diagram illustrating an example 700 of the ferromagnetic contact 205 that is formed from a semi Heusler alloy. For example, the ferromagnetic contact 205 is a semi Heusler alloy that has a $C1_b$ ordered 705 lattice structure. Semi Heusler alloys (e.g., $C1_b$ ordered 705 Heusler alloys) have the form of XYZ, where X-atom 710 and Y-atom 715 are generally selected from the transition elements and Z-atom 720 is generally selected from the lighter elements. As compared with full Heusler alloys, a semi Heusler alloy includes only a single X-atom 710 component, with the location of the other X-atom (e.g., locations 725) left open to result in the $C1_b$ ordered 705 lattice structure. Semi Heusler alloys have many of the same benefits as full Heusler alloys, and the decision as to which lattice structure to use may be dependent on the particular application, including the particular composition that is needed.

As illustrated in FIG. 7, there is one X-atom 710 component, one Y-atom 615 component, and one Z-atom 620 component, with each being identified with a distinctive pattern. While each of the components is identified with a distinctive pattern, it is appreciated that any particular component could be "split" to include two or more elements insomuch as the two or more elements are ordered as per the ordering associated with that particular component. Additionally or alternatively, the same element may be used for more than one component (or portions of a component, for example). As discussed below, the composition of the Heusler alloy may be selected to achieve certain lattice parameters so that the lattice structure of the Heusler alloy matches the crystalline structure of the material that the Heusler alloy interfaces (e.g., has an epitaxial relationship) with.

Figure 8:
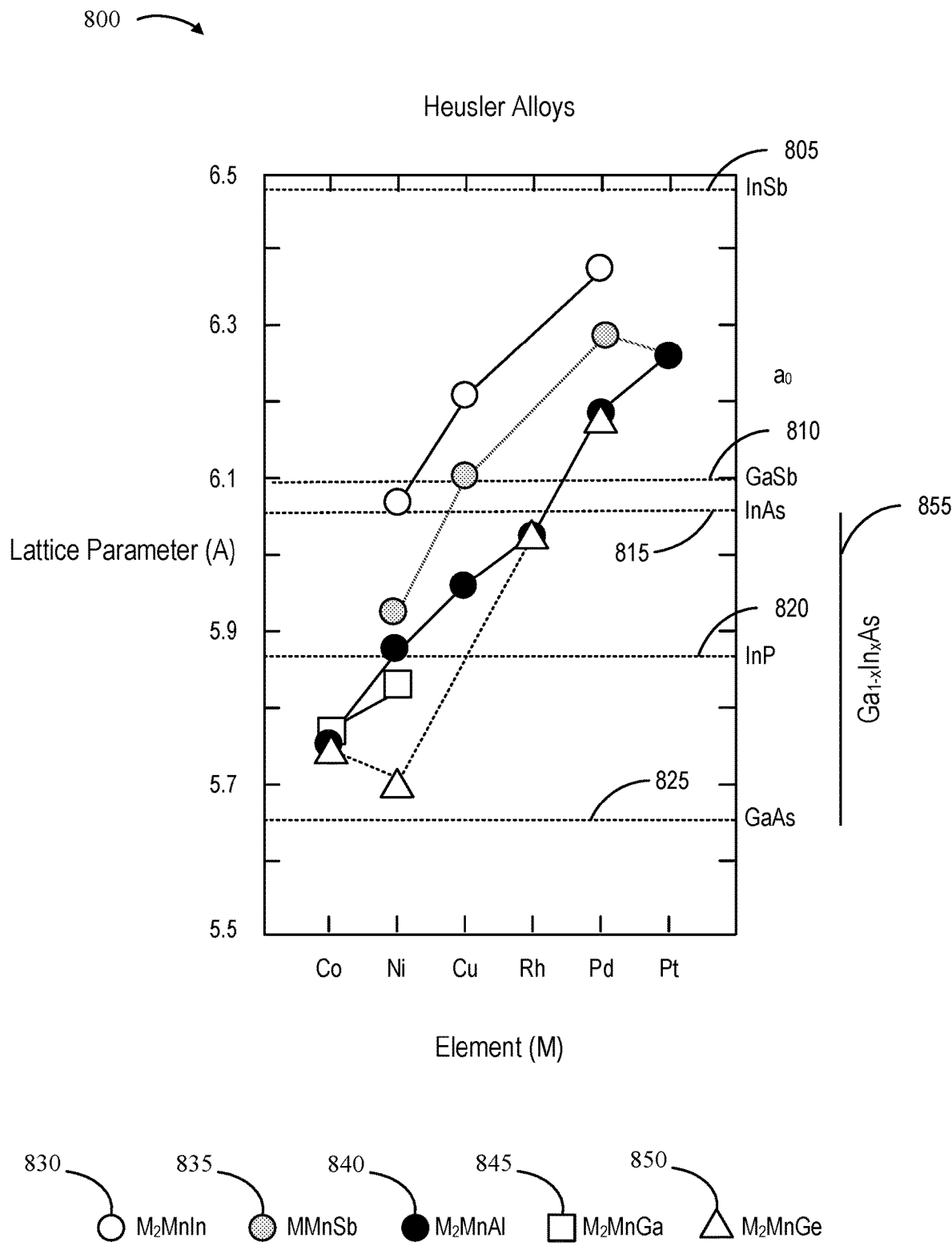
FIG. 8 is a graph illustrating the relationship for Heusler alloys compared to III-V semiconductors.

FIG. 8 is a graph 800 illustrating the relationship for Heusler alloys lattice constants compared to those of III-V semiconductors. It is to be appreciated that the physical size of a crystal lattice is dependent on the composition of the crystal lattice. The lattice parameter or lattice constant refers to the physical dimension of a unit cell of a crystal lattice. Since a crystal lattice has three dimensions, there are generally three lattice parameters, lattice parameter (A) for the A dimension, lattice parameter (B) for the B dimension, and lattice parameter (C) for the C dimension. FIG. 8 illustrates the lattice parameter (A) which is measured in Angstroms (Å). It is further appreciated that the lattice parameter for the various Heusler alloys can be tuned to match the crystal structure of various III-V semiconductors by the choice of the first element (M) (e.g., metal atom) in the respective Heusler alloy. Although the following examples relate to tuning the lattice parameter (A) by the choice of the first element (M) (e.g., the X in the $X_2YZ$ or XYZ general Heusler forms), it is appreciated that the lattice parameter (A) can also be tuned by the selection of other elements (as illustrated by the different Heusler alloy combinations, for example).

For example, FIG. 8 illustrates how the lattice parameter (A) is tuned for different elements (M) for a given Heusler alloy. In one example, $M_2MnIn$ 830, which is an $L2_1$ ordered Heusler alloy, has three possible alloys given the elements (M) as shown: $Ni_2MnIn$, which has a lattice parameter (A) of roughly 5.97 Å, which closely matches the lattice parameter (A) of the III-V semiconductor InAs 815, $Cu_2MnIn$, which has a lattice parameter (A) of roughly 6.2 Å, and $Pd_2MnIn$, which has a lattice parameter (A) of roughly 6.38 Å.

In another example, MIVInSb 835, which is a $C1_b$ ordered Heusler alloy, has four possible alloys given the elements (M) as shown: NiMnSb, which has a lattice parameter (A) of roughly 5.92 Å, CuMnSb, which has a lattice parameter (A) of roughly 6.1 Å, which closely matches the lattice parameter (A) of the III-V semiconductor GaSb 810, PdMnSb, which has a lattice parameter (A) of roughly 6.29 Å, and PtMnSb, which has a lattice parameter (A) of roughly 6.25 Å.

In yet another example, $M_2MnAl$ 840, which is an $L2_1$ ordered Heusler alloy, has six possible alloys given the elements (M) as shown: $Co_2MnAl$, which has a lattice parameter (A) of roughly 5.75 Å, $Ni_2MnAl$, which has a lattice parameter (A) of roughly 5.87 Å, which closely matches the lattice parameter (A) of the III-V semiconductor InP 820, $Cu_2MnAl$, which has a lattice parameter (A) of roughly 5.95 Å, $Rh_2MnAl$, which has a lattice parameter (A) of roughly 6.03 Å, $Pd_2MnAl$, which has a lattice parameter (A) of roughly 6.19 Å, and $Pt_2MnAl$, which has a lattice parameter (A) of roughly 6.25 Å.

In yet another example, $M_2MnGa$ 845, which is an $L2_1$ ordered Heusler alloy, has two possible alloys given the elements (M) as shown: $Co_2MnGa$, which has a lattice parameter (A) of roughly 5.76 Å, and $Ni_2MnGa$, which has a lattice parameter (A) of roughly 6.83 Å.

In a further example, $M_2MnGe$ 850, which is an $L2_1$ ordered Heusler alloy, has four possible alloys given the elements (M) as shown: $Co_2MnGe$, which has a lattice parameter (A) of roughly 5.76 Å, $Ni_2MnGe$, which has a lattice parameter (A) of roughly 5.7 Å, $Rh_2MnGe$, which has a lattice parameter (A) of roughly 6.02 Å, which closely matches the lattice parameter (A) of the III-V semiconductor InAs 815, and $Pd_2MnGe$, which has a lattice parameter (A) of roughly 6.18 Å.

As illustrated in FIG. 8, the III-V semiconductor $Ga_{1-x}In_xAs$ 855 can be tuned to have a lattice parameter (A) that ranges between 5.65 Å (e.g., the lattice parameter (A) of the III-V semiconductor GaAs 825) to 6.06 Å (e.g., the lattice parameter (A) of the III-V semiconductor InAs 815) based on the concentrations of Ga and In. For reference, the lattice parameter (A) of InSb 805 is also identified. It is appreciated that FIG. 8 provides just a few examples of how the lattice parameter (A) of a Heusler alloy can be tuned based on the composition of the Heusler alloy to match or align with the lattice parameter of the semiconductor material (e.g., the upper barrier 120 or QW 115).

Figure 9:
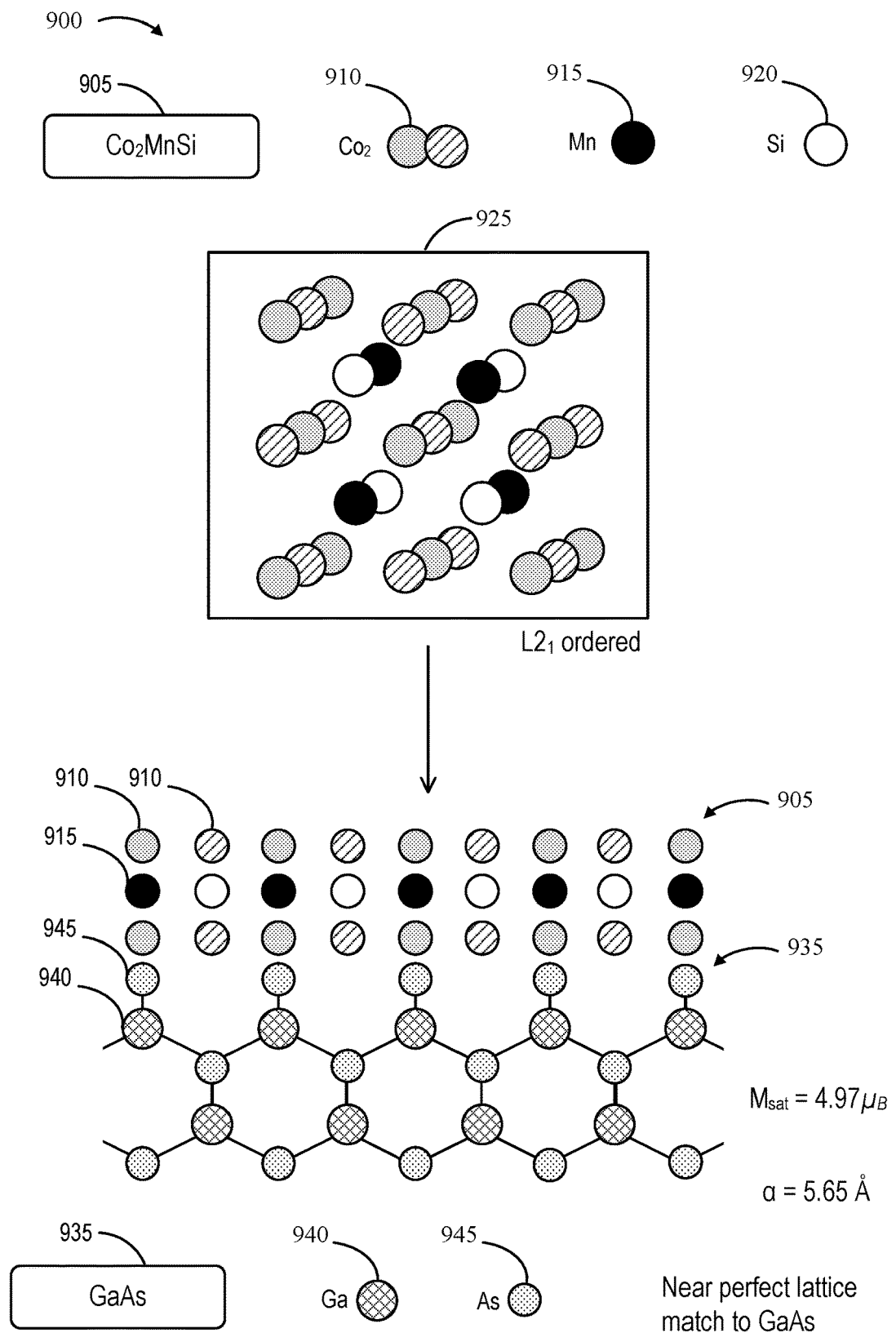
FIG. 9 illustrates one example of the physical effect of matching lattice parameters at an epitaxial interface.

FIG. 9 illustrates an example 900 of the physical effect of matching lattice parameters at an epitaxial interface (e.g., the epitaxial interface 150). It is appreciated that the composition of the Heusler alloy may be selected so that the lattice parameter (A) of the Heusler alloy matches the lattice parameter (A) associated with the crystalline structure that the Heusler alloy interfaces with (e.g., the upper barrier 120 or QW 115). As illustrated, an $L2_1$ ordered Heusler alloy of $Co_2MnSi$ 905 has a near perfect lattice match to GaAs 935. As will be discussed below, this near perfect lattice match impacts the electrical properties of the epitaxial interface.

As illustrated in FIG. 9, the crystalline structure (e.g., $L2_1$ ordered lattice structure) formed by two Co 910, Mn 915, and Si 920 in $Co_2MnSi$ alloy 905 places one of the Co atoms 910 in line with the As atoms 945 in the crystalline structure formed by Ga atom 940 and As atom 945 in GaAs 935. This alignment improves the electrical properties associated with the epitaxial interface between the crystalline structures.

Figure 10:
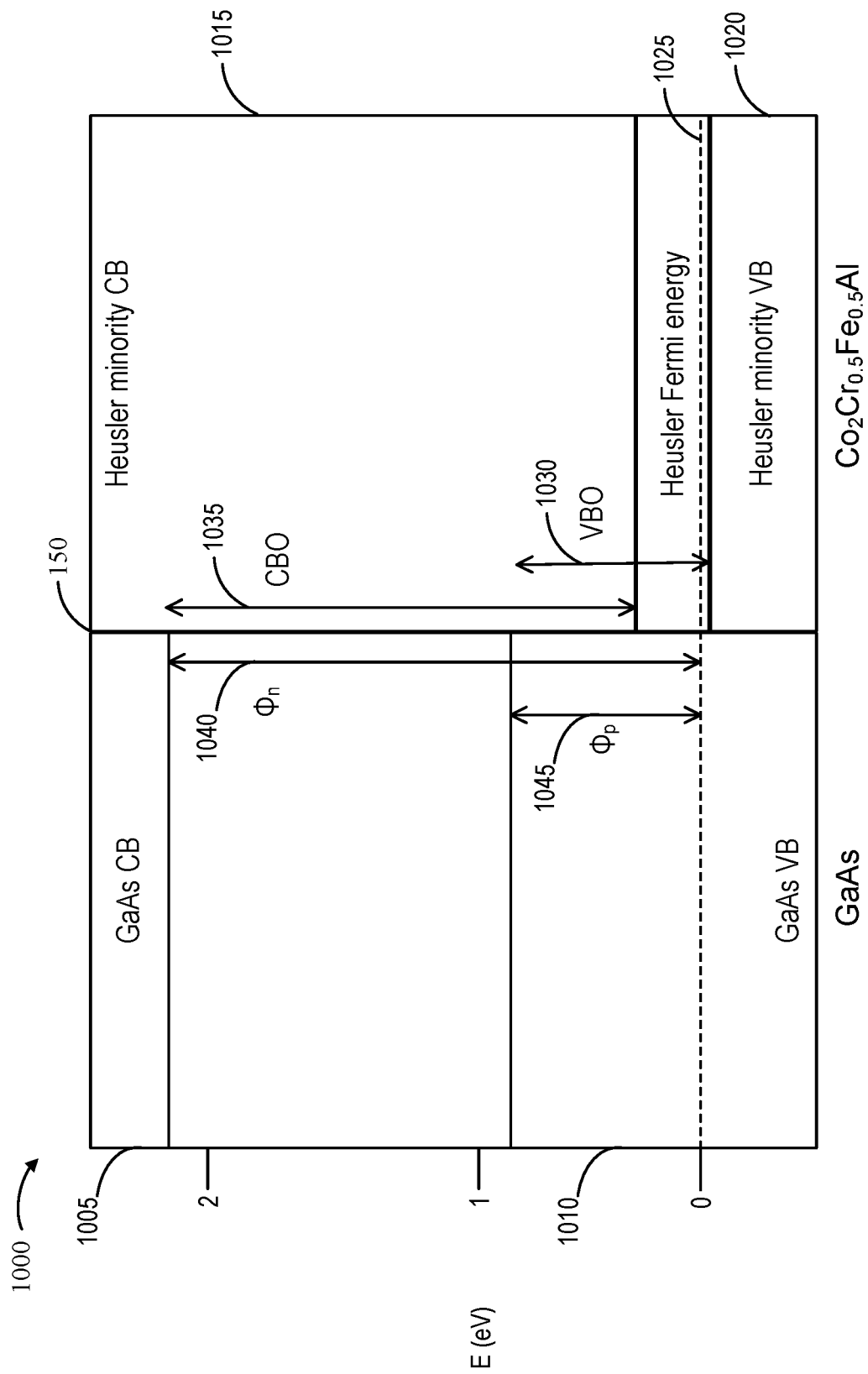
FIG. 10 illustrates one example of the electrical effects of matching lattice parameters at an epitaxial interface.

FIG. 10 illustrates an example 1000 of the electrical effects of matching lattice parameters at an epitaxial interface (e.g., the epitaxial interface 150). In particular, FIG. 10 is a band profile of the epitaxial interface between $Co_2Cr_{0.5}Fe_{0.5}Al$ (which is a $L2_1$ ordered Heusler alloy with the Y component split between Cr and Fe) on the right and the III-V semiconductor GaAs on the left.

As illustrated in the band profile, both crystalline structures have a valence band (e.g., GaAs VB 1010, Heusler minority VB 1020) and a conduction band (e.g., GaAs CB 1005, Heusler minority CB 1015). The energy difference (in terms of electron volts (eV)) between the valence band and the conduction band is referred to as the Fermi energy. The energy level (from zero 1025, zero eV) to get into the GaAs CB 1005 is represented by $\Phi_n$ 1040 and the energy level of the top of the GaAs VB 1010 is represented by $\Phi_p$ 1045. The difference between the energy level of the Heusler minority VB 1020 and the GaAs VB 1010 is referred to as a valence band offset (VBO) 1030 and the difference between the energy level of the Heusler minority CB 1015 and the GaAs CB 1005 is referred to as a conduction band offset (CBO) 1035.

The epitaxial interface 150 can present an energy barrier to passing electrons if the Heusler alloy is not matched with the semiconductor in the epitaxial interface. So the composition of the Heusler alloy can be tuned to as discussed previously. A mismatch in crystalline structure (mismatch in lattice parameters) corresponds with an energy barrier that inhibits the flow of electrons (or holes) through the epitaxial interface 150. So the composition of the Heusler alloy should be selected to minimize (e.g., make zero or negative) the energy barrier associated with the epitaxial interface 150. A zero or negative CBO 1035 or VBO 1030, that is, a CBO 1035 or VBO 1030 that is at or extends below the zero line 1025 leads to a negative Schottky barrier for the epitaxial interface 150. As illustrated in FIG. 10, the VBO 1030 extends below the zero line 1025, which means that the epitaxial interface 150 between $Co_2Cr_{0.5}Fe_{0.5}Al$ and GaAs has a negative Schottky barrier indicating low ohmic resistance of this contact. Minimizing the ohmic resistance or energy barrier at the interface helps maintain the spin state of the electrons (or holes) initialized in the Heusler alloy.

Figure 11:
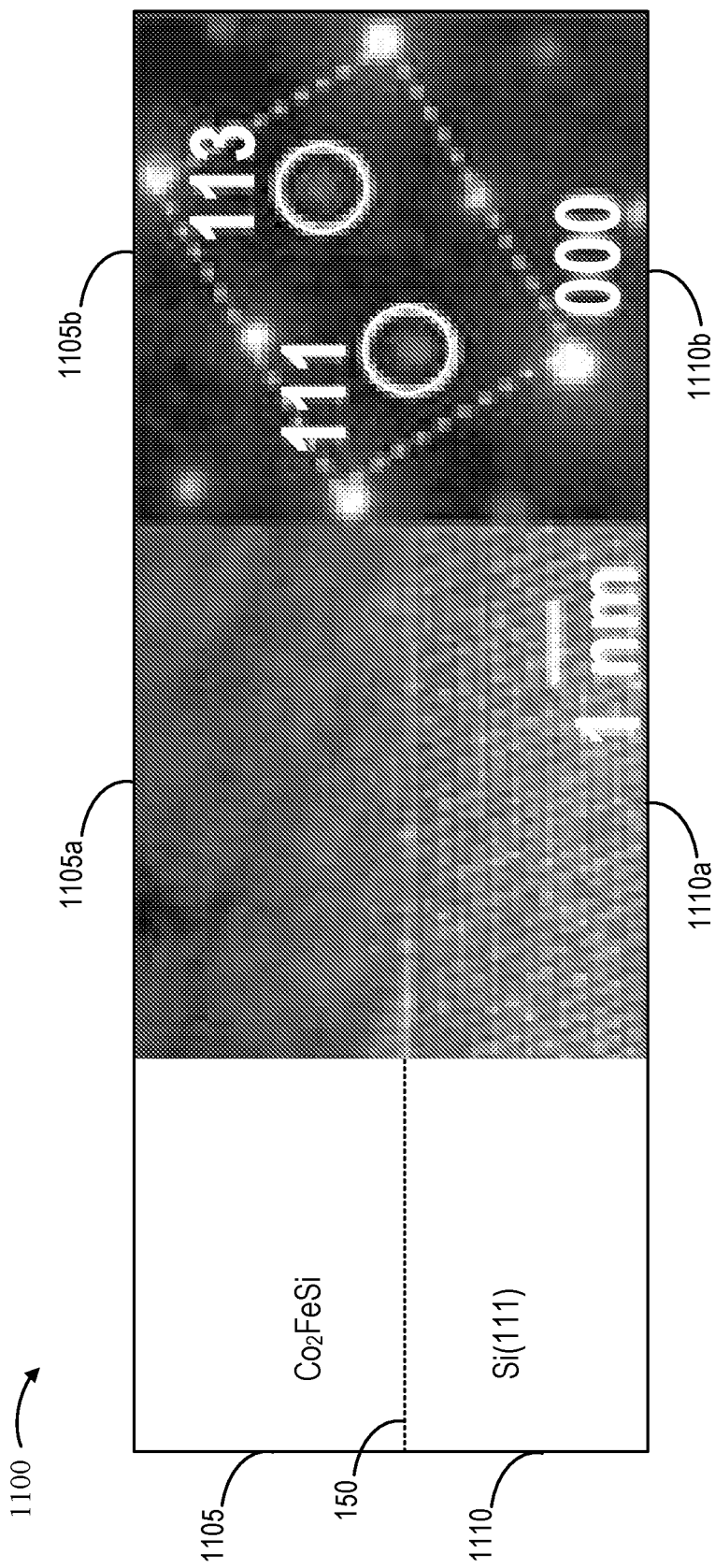
FIG. 11 is a block diagram illustrating one example of an epitaxial interface between a Heusler alloy that has been tuned to match a semiconductor.

FIG. 11 is a block diagram illustrating an example 1100 of the epitaxial interface 150 between a Heusler alloy 1105 that has been tuned to match a semiconductor 1110. The Heusler alloy 1105, which in this case is $Co_2FeSi$, and the semiconductor 1110, which in this case is Si(111) (Si with the 111 crystalline structure), are illustrated at both the aggregate crystalline structure level (e.g., 1105a, 1110a) and at the atomic interface level (1105b, 1110b). As illustrated, at the atomic interface level (1105b, 1110b), the crystalline structure of the Heusler alloy 1105 has been tuned to match/align with the crystalline structure of the semiconductor 1110 so that the interfacing elements at the epitaxial interface 150 are aligned in an ordered manner, as shown (e.g., 111 and 113 are aligned in the crystalline unit defined with respect to point 000). As discussed above, the composition of the Heusler alloy 1105 is selected (tuned) so that the crystalline structure of the Heusler alloy 1105 matches the crystalline structure of the underlying semiconductor 1110 (that the Heusler alloy 1105 is grown from, for example). This physical alignment/matching corresponds with desirable electrical interface properties at the epitaxial interface 150. For example, a zero or negative Schottky barrier at the epitaxial interface 150 so that an electron (or hole) passing through the epitaxial interface 150 is not inhibited by an energy barrier or ohmic resistance at the epitaxial interface 150.

Figure 12:
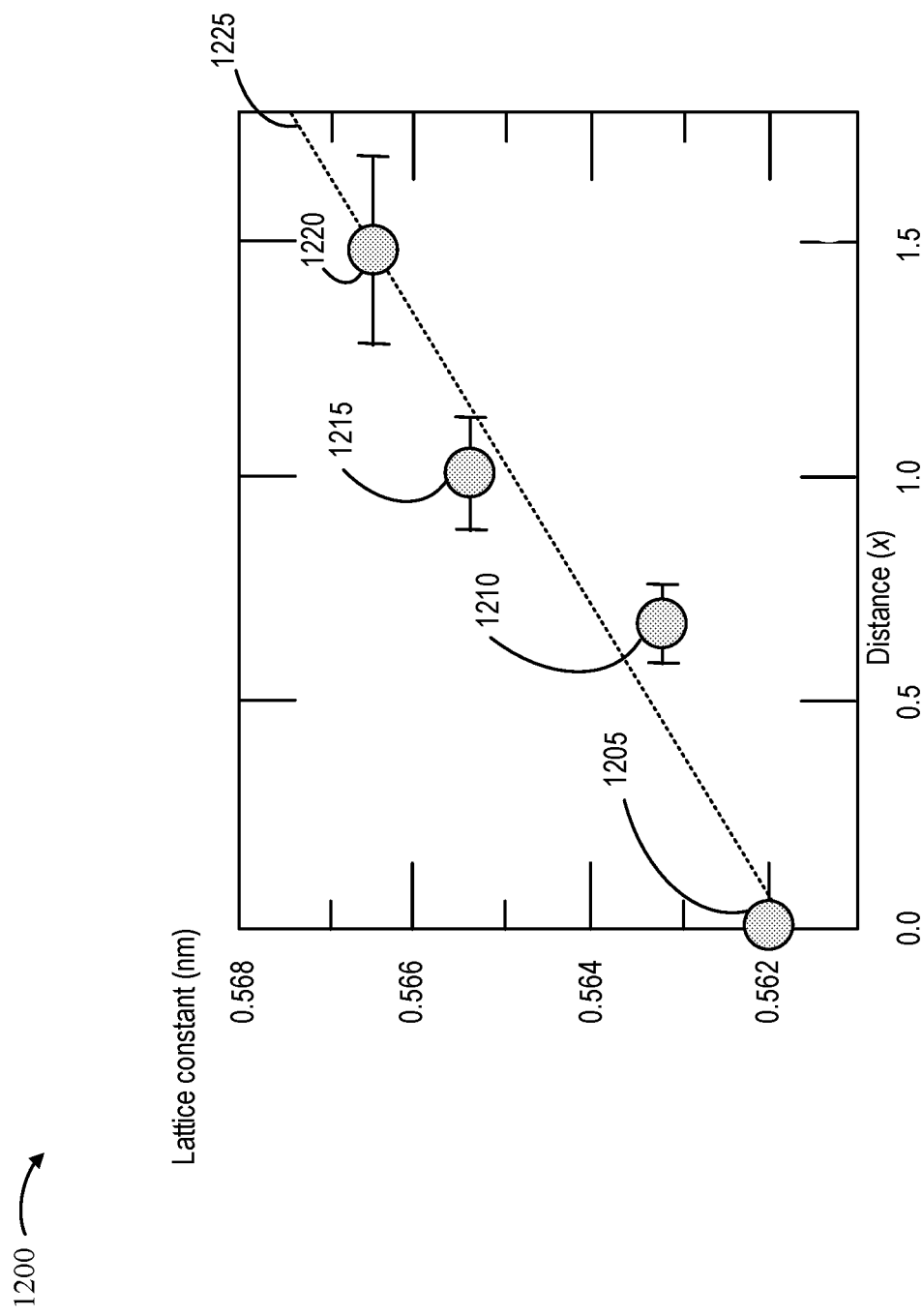
FIG. 12 is graph illustrating one example of how the composition of a Heusler alloy can be adjusted to tune the lattice constant of the Heusler alloy.

FIG. 12 is a graph 1200 illustrating one example of how the composition of a Heusler alloy can be adjusted to tune the lattice constant of the Heusler alloy. In this example, the Heusler alloy is $Fe_{3-x}Mn_xSi$ where the Mn concentration (x) is tunable. As illustrated in the graph 1200, when the concentration x is zero (e.g., $Fe_3Si$) then the lattice parameter or lattice constant 1205 is 0.562 nm, when the concentration x is 0.6 (e.g., $Fe_{2.4}Mn_{0.6}Si$) then the lattice constant 1210 is roughly 0.563 nm, when the concentration x is 1.0 (e.g., $Fe_2MnSi$) then the lattice constant 1215 is roughly 0.5653 nm, and when the concentration x is 1.4 (e.g., $Fe_{1.6}Mn_{1.4}Si$) then the lattice constant 1220 is roughly 0.563 nm. As illustrated, this tuning of the Mn concentration x results in a fairly linear 1225 tuning of the lattice constant. Using such techniques, the lattice constant or lattice parameter of the Heusler alloy can be tuned to match the crystalline structure of the semiconductor that the Heusler alloy has an epitaxial interface with.

In some cases, the device for quantum computing 100 as illustrated in FIG. 1 can be repeated with the channels adjacent to each other to form a double quantum well device. The functionality of a double quantum well can be modeled using matrix formalism for multi node capacitances. In one example, the energy of a 1×2 double quantum well system is set forth in equation (1), where $Q_1$ and $Q_2$ are the charges on the quantum bits, $C_{g1}$ and $C_{g2}$ are capacitances to the controlling gates, and $V_{g1}$ and $V_{g2}$ are the gate voltages controlling the height of confining potentials.

$$U = \frac{1}{2}\begin{bmatrix} Q_1 + C_{g1}V_{g1} \\ Q_2 + C_{g2}V_{g2} \end{bmatrix}\begin{bmatrix} V_1 \\ V_1 \end{bmatrix} = \quad \text{Equation (1)}$$

-continued
$$\frac{1}{2}\frac{1}{C_1C_2 - C_m^2}\begin{bmatrix} Q_1 + C_{g1}V_{g1} \\ Q_2 + C_{g2}V_{g2} \end{bmatrix}^T \begin{bmatrix} C_2 & C_m \\ C_m & C_1 \end{bmatrix}\begin{bmatrix} Q_1 + C_{g1}V_{g1} \\ Q_2 + C_{g2}V_{g2} \end{bmatrix}$$

Figure 13:
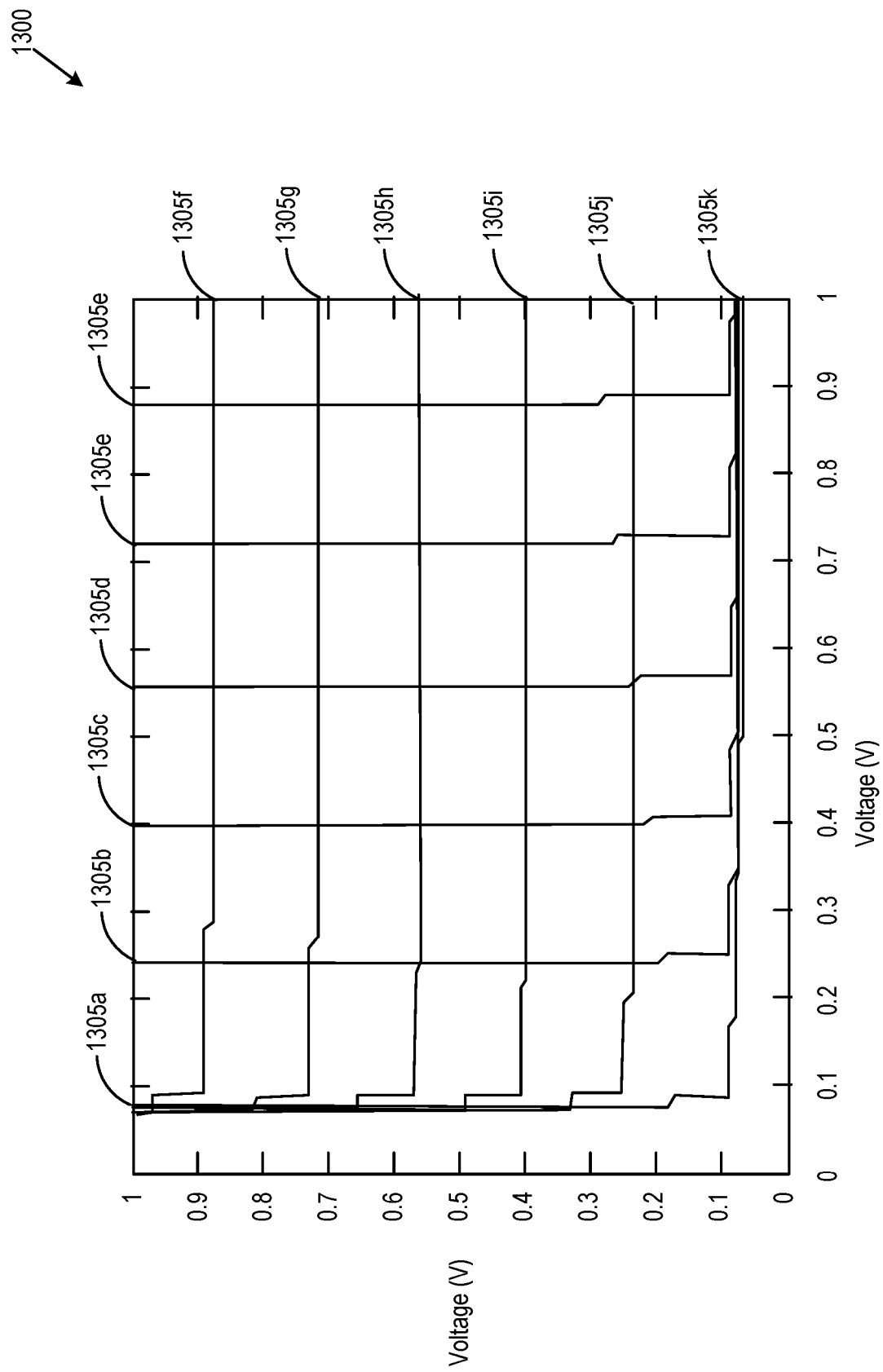
FIG. 13 is a graph that illustrates the electron occupancy in a double quantum well system.

FIG. 13 is a graph 1300 that illustrates the electron occupancy in a double quantum well system. As illustrated in FIG. 13, each square stability region defined by voltages 1305a-k represents a (k,l) electron occupancy in the double quantum well system, where the X axis and the Y axis are the voltages on the gates (e.g., left QD gate 130a, right QD gate 130b).

Figure 14:
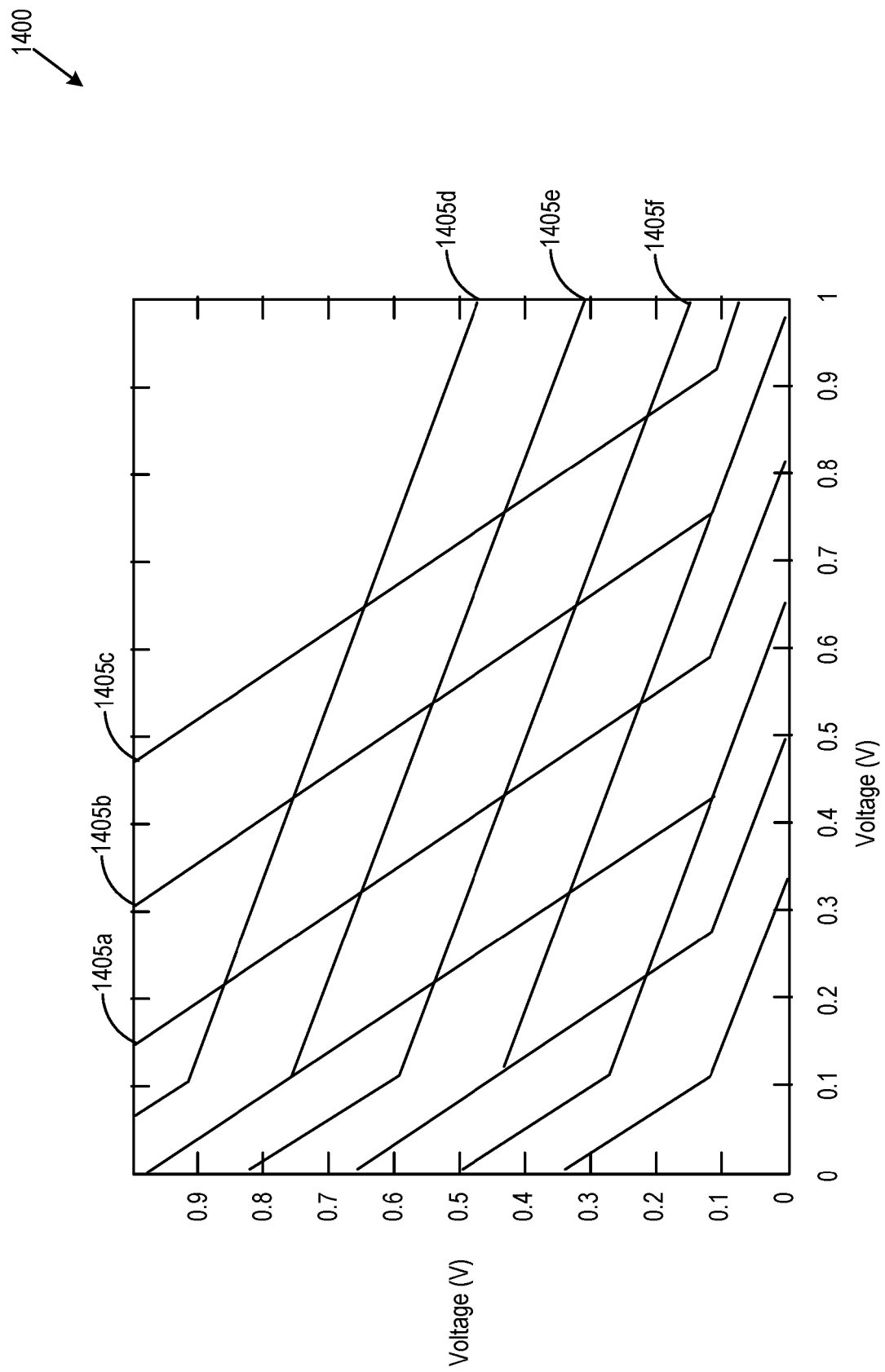
FIG. 14 is a graph that illustrates an example of how the tuning of the coupling between the quantum wells (using Bragg grating) allows tuning of the shape of the stability plots, where the X axis and the Y axis are the voltages on the gates.

FIG. 14 is a graph 1400 that illustrates an example of how the tuning of the coupling between the quantum wells (using Bragg grating) allows tuning of the shape of the stability plots, where the X axis and the Y axis are the voltages (e.g., 1405a-f) on the gates (e.g., left QD gate 130a, right QD gate 130b). The operation of the 1×2 qubit array with controlled coupling to the source and drain is illustrated in FIG. 14. It is appreciated that the number state of the qubits is given by the maximum number of electrons at which the qubits have a negative electro-chemical potential. In some cases, the graphs 1300 and 1400 as illustrated in FIGS. 13 and 14 indicate how a qubit is written, given the spin state initialization by the ferromagnetic contact 205, as discussed previously.

Figure 15:
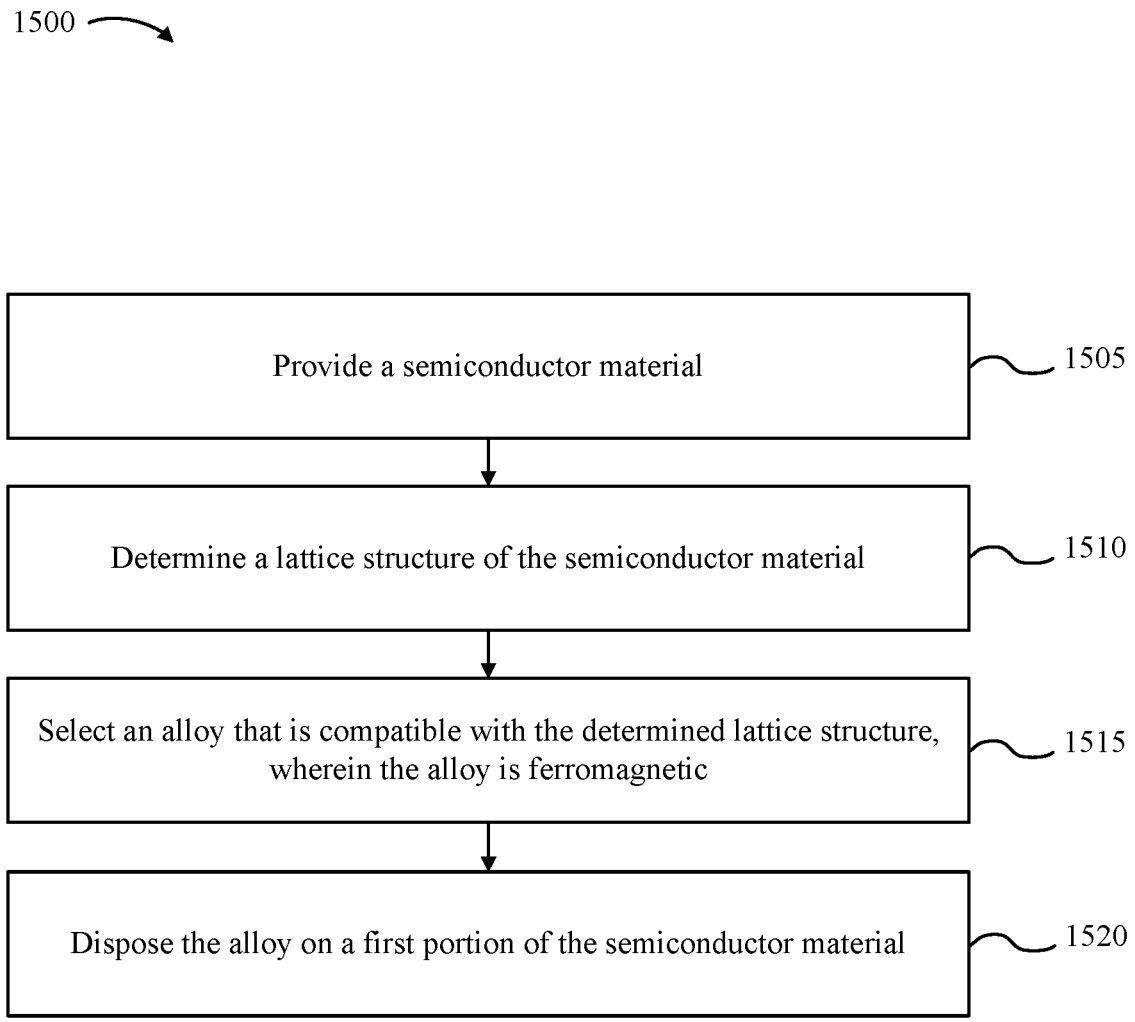
FIG. 15 illustrates a method for manufacturing a ferromagnetic contact for a quantum computing device.

FIG. 15 illustrates a method 1500 for manufacturing a ferromagnetic contact for a quantum computing device. At 1505 a semiconductor material is provided. In one example, the semiconductor material forms a quantum well. In another example, the semiconductor material forms a barrier that separates the semiconductor material from the ferromagnetic contact. At 1510, a lattice structure of the semiconductor material is determined. At 1515 an alloy that is compatible with the determined lattice structure is selected. The alloy may be a ferromagnetic alloy, such as a traditional ferromagnetic alloy or a Heusler alloy, for example. At 1520, the alloy is disposed on a first portion of the semiconductor material.

Figure 16:
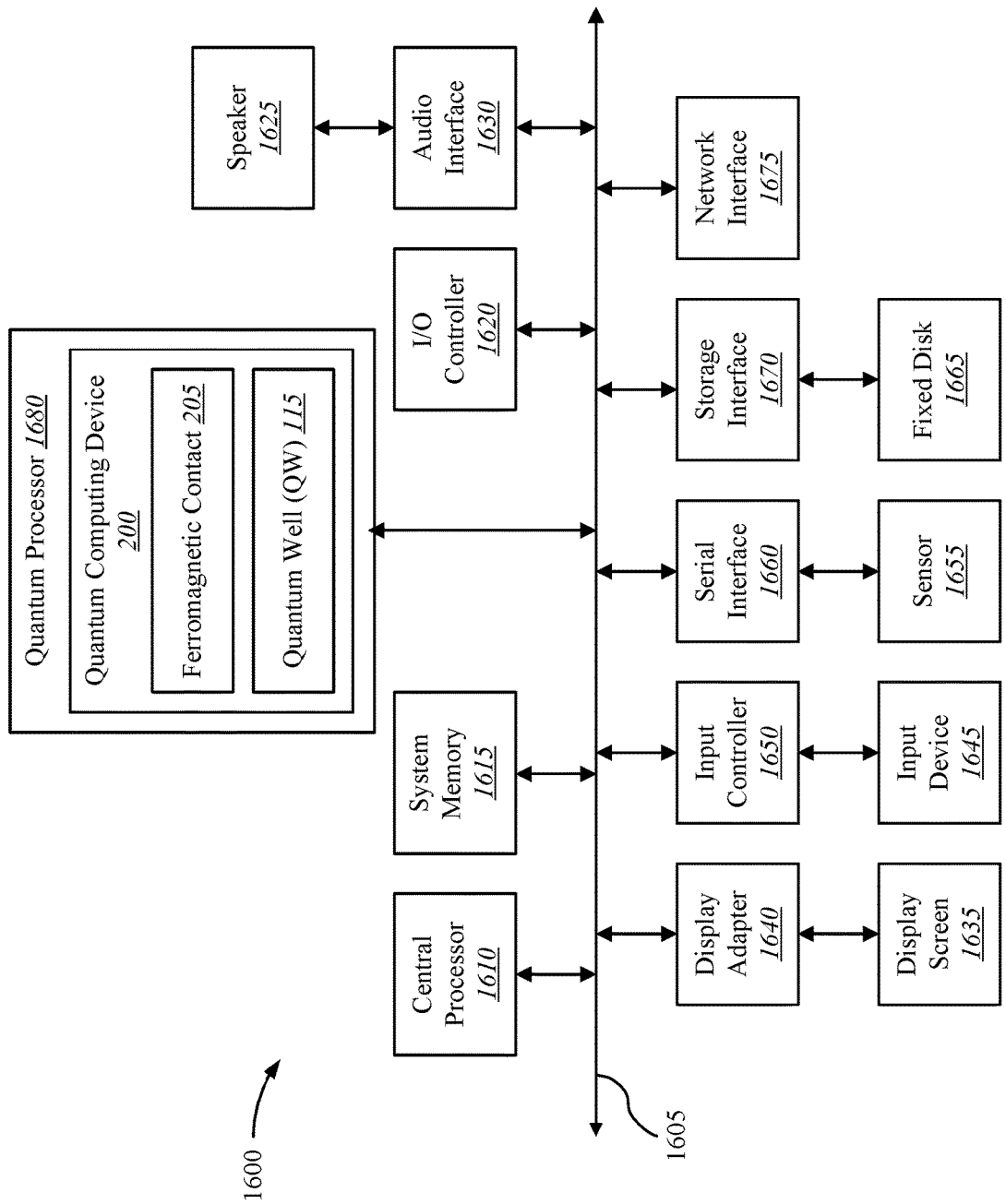
FIG. 16 depicts a block diagram of a computer system that incorporates the present systems and methods.

FIG. 16 depicts a block diagram of a computer system 1600 that incorporates the present systems and methods. The computer system 1600 includes a bus 1605 that interconnects major subsystems of the computer system 1600, such as a central processor 1610, a system memory 1615 (typically RAM, but which may also include ROM, flash RAM, embedded DRAM (eDRAM), SRAM, spin-transfer torque memory (STT-MRAM), or the like), an input/output (I/O) controller 1620, an external audio device, such as a speaker system 1625 via an audio output interface 1630, an external device, such as a display screen 1635 via a display adapter 1640, an input device 1645 (e.g., keyboard, touchpad, touch screen, voice recognition module, etc.) (interfaced with an input controller 1650), a sensor 1655 via a serial interface 1660, a fixed disk (or other storage medium, for example) 1665 via a storage interface 1670, and a network interface 1675 (coupled directly to the bus 1605). In addition, the computer system 1600 includes a quantum processor 1680. In some cases, the quantum processor 1680 may be included as part of the central processor 1610. The quantum processor 1680 includes a quantum computing device 200 that includes a ferromagnetic contact 205 and a QW 115.

The bus 1605 allows data communication between the central processor 1610 and the system memory 1615, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS), which controls basic hardware operation such as the interaction with peripheral components or devices. Applications resident with the computer system 1600 are generally stored on and accessed via a non-transitory computer readable medium, such as a hard disk drive (e.g., the fixed disk 1665) or another storage medium.

The storage interface 1670, as with the other storage interfaces of the computer system 1600, can connect to a standard computer readable medium for storage and/or retrieval of information, such as a fixed disk drive (e.g., the fixed disk 1665). The fixed disk 1665 may be a part of the computer system 1600 or may be separate and accessed through other interface systems. The network interface 1675 may provide a direct connection to a remote server via a direct network link to the Internet. The network interface 1675 may provide such connection using wireless techniques, including digital cellular telephone connection, Cellular Digital Packet Data (CDPD) connection, digital satellite data connection, or the like.

Many other devices or subsystems (not shown) may be connected in a similar manner. Conversely, all of the devices shown in FIG. 16 need not be present to practice the present systems and methods. The devices and subsystems can be interconnected in different ways from that shown in FIG. 16. The operation of a computer system such as that shown in FIG. 16 is readily known in the art and is not discussed in detail in this application.

In various embodiments, the computer system 1600 may be a laptop computer, a netbook computer, a notebook computer, an ultrabook computer, a field programmable gate array (FPGA), a smartphone, a dumbphone, a tablet, a tablet/laptop hybrid, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computer system 1600 may be any other electronic device that processes data.

Example Embodiments

Example 1 is an apparatus for quantum computing. The apparatus includes a quantum well and a pair of contacts. At least one of the pair of contacts is formed of a ferromagnetic material. One of the contacts in the pair of contacts interfaces with a semiconductor material at a first position adjacent to the quantum well and the other contact in the pair of contacts interfaces with the semiconductor material at a second position adjacent to the quantum well.

Example 2 is the apparatus of example 1, where a current through the pair of contacts injects an electron into the quantum well, and where the ferromagnetic material of the contact that the electron passes through initializes the electron with a specific spin state based on a magnetization of the ferromagnetic material.

Example 3 is the apparatus of example 1, wherein the ferromagnetic material is a Heusler alloy, the Heusler alloy having a formula of $X_2YZ$.

Example 4 is the apparatus of example 3, where the Heusler alloy is selected based on the semiconductor material.

Example 5 is the apparatus of example 4, where the Heusler alloy is selected so that a lattice structure of the Heusler alloy matches a lattice structure of the semiconductor material. In other words, so that the lattice parameter of the Heusler alloy matches the lattice parameter of the semiconductor material.

Example 6 is the apparatus of example 4, where the Heusler alloy is selected so that a Schottky barrier at an interface between the Heusler alloy and the semiconductor material is zero or negative.

Example 7 is the apparatus of example 4, where the Heusler alloy is selected so that at least one of a carrier band offset (CBO) and a valence band offset (VBO) of the Heusler alloy has a zero or negative electron band component.

Example 8 is the apparatus of any of examples 1-7, where the semiconductor material is the quantum well. That is, the quantum well is formed of the semiconductor material.

Example 9 is the apparatus of any of examples 1-7, where the semiconductor material is a barrier between the ferromagnetic material and the quantum well. That is, the barrier (e.g., tunnel barrier) between the ferromagnetic contact and the quantum well is formed of the semiconductor material.

Example 10 is the apparatus of example 10, where the ferromagnetic material for each of the pair of contacts is a same ferromagnetic material.

Example 11 is the apparatus of example 1, where one of the pair of contacts is a source contact and the other of the pair of contacts is a drain contact.

Example 12 is the apparatus of example 11, where the source contact is formed of a first ferromagnetic material having a first composition and the drain contact is formed of a second ferromagnetic material having a second composition that is different from the first composition.

Example 13 is the apparatus of example 1, where the apparatus further includes a second quantum well and a second pair of contacts. At least one or each contact in the second pair of contacts is formed of the ferromagnetic material. One of the contacts in the second pair of contacts interfaces with the second quantum well at a first position adjacent to the second quantum well and the other contact in the second pair of contacts interfaces with the second quantum well at a second position adjacent to the second quantum well.

Example 14 is the apparatus of example 1, where the semiconductor material is a group IV semiconductor material.

Example 15 is the apparatus of example 1, where the semiconductor material is a group III-V semiconductor material.

Example 16 is a method for manufacturing a quantum well device. The method includes providing a semiconductor material, determining a lattice structure of the semiconductor material, selecting an alloy that is compatible with the determined lattice structure, and disposing the alloy on a first portion of the semiconductor material. The alloy is a ferromagnetic material.

Example 17 is the method of example 16, where selecting the alloy that is compatible with the determined lattice structure includes selecting the alloy that has a lattice structure that matches the determined lattice structure. In other words, the lattice parameter matches the lattice parameter associated with the determined lattice structure.

Example 18 is the method of example 16, where selecting the alloy that is compatible with the determined lattice structure includes selecting the alloy that results in a zero or negative Schottky barrier at an interface between the semiconductor material and the alloy.

Example 19 is the method of example 16, where selecting the alloy that is compatible with the determined lattice structure includes selecting the alloy that has at least one of a carrier band offset (CBO) and a valence band offset (VBO) that has a zero or negative electron band component.

Example 20 is the method of example 16, where the first portion of the semiconductor material is positioned at a first position adjacent to the quantum well.

Example 21 is the method of example 20, where the method further includes disposing the alloy on a second portion of the semiconductor material, where the second portion of the semiconductor material is positioned at a second position adjacent to the quantum well.

Example 22 is the method of example 21, where the method further includes disposing a gate electrode on a third portion of the semiconductor material, where the third portion is between the first portion of the semiconductor material and the second portion of the semiconductor material.

Example 23 is the method of example 22, where the gate electrode is a plunger gate electrode.

Example 24 is the method of example 16, where the alloy is deposited using magnetron sputtering.

Example 25 is the method of example 16, where the alloy is deposited off-axis.

Example 26 is the method of example 25, where the alloy is deposited with an angle of deposition of at least 30 degrees.

Example 27 is the method of any of examples 16-26, where the alloy is a Heusler alloy.

Example 28 is the method of example 27, where the Heusler alloy has a formula of $X_2YZ$.

Example 29 is the method of example 16, where the semiconductor material is a group IV semiconductor material.

Example 30 is the method of example 16, where the semiconductor material is a group III-V semiconductor material.

Example 31 is a computing device. The computing device includes a processor. The processor includes a quantum well and a pair of contacts. At least one of or each of the contacts is formed of a ferromagnetic material. One of the contacts in the pair of contacts interfaces with a semiconductor material at a first position adjacent to the quantum well and the other contact in the pair of contacts interfaces with the semiconductor material at a second position adjacent to the quantum well.

Example 32 is the computing device of example 31, where a current through the pair of contacts injects an electron into the quantum well, and where the ferromagnetic material of the contact that the electron passes through initializes the electron with a specific spin state based on a magnetization of the ferromagnetic material.

Example 33 is the computing device of example 31, where the ferromagnetic material is a Heusler alloy, the Heusler alloy having a formula of $X_2YZ$.

Example 34 is the computing device of example 33, where the Heusler alloy is selected based on the semiconductor material.

Example 35 is the computing device of example 34, where the Heusler alloy is selected so that a lattice structure of the Heusler alloy matches a lattice structure of the semiconductor material.

Example 36 is the computing device of example 34, where the Heusler alloy is selected so that a Schottky barrier at an interface between the Heusler alloy and the semiconductor material is zero or negative.

Example 37 is the computing device of example 34, where the Heusler alloy is selected so that at least one of a carrier band offset (CBO) and a valence band offset (VBO) of the Heusler alloy has a zero or negative electron band component.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

The invention claimed is:

1. An apparatus for quantum computing, the apparatus comprising:
    a quantum well;
    a pair of contacts, wherein each of the contacts is formed of a ferromagnetic material, and wherein a first contact of the pair of contacts interfaces with a semiconductor material at a first position adjacent to the quantum well and a second contact of the pair of contacts interfaces with the semiconductor material at a second position adjacent to the quantum well; and
    a plurality of gate electrodes over a portion of the quantum well between the first contact and the second contact,
    wherein the plurality of gate electrodes include an odd number of gate electrodes, and wherein the plurality of gat electrodes are configured to control formation of a quantum dot in each portion of the quantum well that is substantially opposite an even gate electrode of the odd number of gate electrodes.

2. The apparatus of claim 1, wherein, during operation of the apparatus, a current through the pair of contacts injects an electron into the quantum well, and wherein the ferromagnetic material of the contact that the electron passes through initializes the electron with a specific spin state based on a magnetization of the ferromagnetic material.

3. The apparatus of claim 1, wherein the ferromagnetic material comprises a Heusler alloy.

4. The apparatus of claim 3, wherein lattice structure of the Heusler alloy matches a lattice structure of the semiconductor material.

5. The apparatus of claim 3, wherein least one of a carrier band offset (CBO) and a valence band offset (VBO) of the Heusler alloy has a zero or negative electron band component.

6. The apparatus of claim 1, wherein the semiconductor material is the quantum well.

7. The apparatus of claim 1, wherein the semiconductor material is a barrier between the ferromagnetic material and the quantum well.

8. The apparatus of claim 1, wherein the ferromagnetic material for each of the pair of contacts is a same ferromagnetic material.

9. The apparatus of claim 1, wherein the first contact is a source contact and the second contact is a drain contact.

10. The apparatus of claim 9, wherein the source contact is formed of a first ferromagnetic material having a first composition and the drain contact is formed of a second ferromagnetic material having a second composition that is different from the first composition.

11. The apparatus of claim 1, further comprising:
    a second quantum well; and
    a second pair of contacts, wherein each contact in the second pair of contacts is formed of the ferromagnetic material, and wherein one of the contacts in the second pair of contacts interfaces with the second quantum well at a first position adjacent to the second quantum well and the other contact in the second pair of contacts interfaces with the second quantum well at a second position adjacent to the second quantum well.

12. The apparatus of claim 1, wherein the semiconductor material comprises a group IV semiconductor material.

13. The apparatus of claim 1, wherein the semiconductor material comprises a group III-V semiconductor material.

14. A method for manufacturing a quantum well device, comprising:
providing a quantum well;
providing a pair of contacts, wherein each of the contacts is formed of a ferromagnetic material, and wherein a first contact pf the pair of contacts interfaces with a semiconductor material at a first position adjacent to the quantum well and a second contact of the pair of contacts interfaces with the semiconductor material at a second position adjacent to the quantum well; and
providing a plurality of gate electrodes over a portion of the quantum well between the first contact and the second contact,
wherein the plurality of gate electrodes include an odd number of gate electrodes, and wherein the plurality of gate electrodes are configured to control formation of a quantum dot in each portion of the quantum well that is substantially opposite an even gate electrode of the odd number of gate electrode.

15. The method of claim 14, wherein the ferromagnetic material comprises and alloy.

16. The method of claim 15, wherein a lattice structure of the alloy matches a lattice structure of the semiconductor material.

17. The method of claim 15, wherein at least one of a carrier band offset (CBO) and a valence band offset (VBO) of the alloy has a zero or negative electron band component.

18. The method of claim 15, wherein the alloy is deposited using magnetron sputtering.

19. The method of claim 15, wherein the alloy is deposited off-axis.

20. The method of claim 19, wherein the alloy is deposited with an angle of deposition of at least 30 degrees.

21. A computing device, comprising:
a processor, wherein the processor comprises:
a quantum well;
a pair of contacts, wherein each of the contacts is formed of a ferromagnetic material, and wherein a first contact of the pair of contacts interfaces with a semiconductor material at a first position adjacent to the quantum well and a second contact of the pair of contacts interfaces with the semiconductor material at a second position adjacent to the quantum well; and
a plurality of gate electrodes over a portion of the quantum well between the first contact and the second contact,
wherein the plurality of gate electrodes include an odd number of gate electrodes, and wherein the plurality of gate electrodes are configured to control formation of a quantum dot in each portion of the quantum well that is substantially opposite an even gate electrode of the odd number of gate electrodes.

22. The apparatus of claim 1, wherein the plurality of gate electrodes are further to control that no quantum dots are formed portions of the quantum well that are substantially opposite odd gate electrodes of the plurality of gate electrodes.

23. The computing device of claim 21, wherein the plurality of gate electrodes are further to control that no quantum dots are formed in portions of the quantum well that are substantially opposite odd gate electrodes of the plurality of gate electrodes.

* * * * *

UNITED STATES PATENT AND TRADEMARK OFFICE
CERTIFICATE OF CORRECTION

| | | |
|---|---|---|
| PATENT NO. | : 11,264,476 B2 | Page 1 of 1 |
| APPLICATION NO. | : 16/349201 | |
| DATED | : March 1, 2022 | |
| INVENTOR(S) | : Sasikanth Manipatruni et al. | |

It is certified that error appears in the above-identified patent and that said Letters Patent is hereby corrected as shown below:

In the Claims

In Column 16, Claim 1, Line 28, delete "gat" and insert -- gate --, therefor.

In Column 16, Claim 5, Line 43, delete "least" and insert -- at least --, therefor.

In Column 17, Claim 15, Line 29, delete "and alloy" and insert -- an alloy --, therefor.

Signed and Sealed this
Thirty-first Day of May, 2022

Katherine Kelly Vidal
*Director of the United States Patent and Trademark Office*